US010553720B2

(12) United States Patent
Chu et al.

(10) Patent No.: US 10,553,720 B2
(45) Date of Patent: Feb. 4, 2020

(54) METHOD OF REMOVING AN ETCH MASK

(71) Applicant: Taiwan Semiconductor Manufacturing Company, Ltd., Hsinchu (TW)

(72) Inventors: Chun-Han Chu, Hsinchu (TW); Nai-Chia Chen, Hsinchu (TW); Jui-Ming Shih, Hsinchu (TW); Ping-Jung Huang, Douliou (TW); Tsung-Min Chuo, Taipei (TW); Bi-Ming Yen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/796,398

(22) Filed: Oct. 27, 2017

(65) Prior Publication Data

US 2018/0151735 A1    May 31, 2018

Related U.S. Application Data

(60) Provisional application No. 62/427,704, filed on Nov. 29, 2016.

(51) Int. Cl.
*H01L 21/02* (2006.01)
*H01L 21/30* (2006.01)
(Continued)

(52) U.S. Cl.
CPC ...... *H01L 29/7848* (2013.01); *H01L 21/0206* (2013.01); *H01L 21/02381* (2013.01);
(Continued)

(58) Field of Classification Search
CPC ................................................. H01L 21/02667
See application file for complete search history.

(56) References Cited

U.S. PATENT DOCUMENTS

| 5,919,311 A | 7/1999 | Shive et al. |
| 8,772,109 B2 | 7/2014 | Colinge |

(Continued)

FOREIGN PATENT DOCUMENTS

| JP | 2005020011 A | 1/2005 |
| KR | 20010059193 A | 7/2001 |

(Continued)

*Primary Examiner* — Moazzam Hossain
*Assistant Examiner* — Omar F Mojaddedi
(74) *Attorney, Agent, or Firm* — Slater Matsil, LLP

(57) ABSTRACT

An embodiment method includes forming a patterned etch mask over a target layer and patterning the target layer using the patterned etch mask as a mask to form a patterned target layer. The method further includes performing a first cleaning process on the patterned etch mask and the patterned target layer, the first cleaning process including a first solution. The method additionally includes performing a second cleaning process to remove the patterned etch mask and form an exposed patterned target layer, the second cleaning process including a second solution. The method also includes performing a third cleaning process on the exposed patterned target layer, and performing a fourth cleaning process on the exposed patterned target layer, the fourth cleaning process comprising the first solution.

20 Claims, 28 Drawing Sheets

(51) Int. Cl.
  *H01L 21/76* (2006.01)
  *H01L 29/78* (2006.01)
  *H01L 21/308* (2006.01)
  *H01L 21/306* (2006.01)
  *H01L 21/324* (2006.01)
  *H01L 21/762* (2006.01)
  *H01L 29/08* (2006.01)
  *H01L 29/165* (2006.01)
  *H01L 29/417* (2006.01)
  *H01L 29/66* (2006.01)

(52) U.S. Cl.
  CPC .. *H01L 21/02532* (2013.01); *H01L 21/02579* (2013.01); *H01L 21/02667* (2013.01); *H01L 21/3081* (2013.01); *H01L 21/30625* (2013.01); *H01L 21/324* (2013.01); *H01L 21/76224* (2013.01); *H01L 29/0847* (2013.01); *H01L 29/165* (2013.01); *H01L 29/41791* (2013.01); *H01L 29/66795* (2013.01); *H01L 29/785* (2013.01)

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2004/0129361 A1* | 7/2004 | Chen .................. H01L 43/12 156/58 |
| 2004/0266205 A1 | 12/2004 | Han et al. |
| 2006/0148197 A1 | 7/2006 | Wu et al. |
| 2010/0068874 A1* | 3/2010 | Chang ............ H01L 21/0271 438/584 |
| 2013/0048605 A1 | 2/2013 | Sapre et al. |
| 2014/0342532 A1* | 11/2014 | Zhu ................. H01L 21/3105 438/476 |
| 2015/0076514 A1* | 3/2015 | Morin ............. H01L 29/7843 257/77 |
| 2015/0128991 A1 | 5/2015 | Brown et al. |
| 2015/0147882 A1* | 5/2015 | Yao ............... H01L 21/76879 438/675 |
| 2017/0087843 A1* | 3/2017 | Mikoshiba ............ B41J 2/1628 |
| 2017/0330770 A1* | 11/2017 | Kim ........................ B08B 1/04 |

FOREIGN PATENT DOCUMENTS

| | | |
|---|---|---|
| KR | 20080060330 A | 7/2008 |
| TW | 200834685 A | 8/2008 |

* cited by examiner

METHOD OF REMOVING AN ETCH MASK

PRIORITY CLAIM AND CROSS-REFERENCE

This application claims the benefit of U.S. Provisional Application No. 62/427,704, entitled "Method of Removing an Etch Mask," filed Nov. 29, 2016, contents of which is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
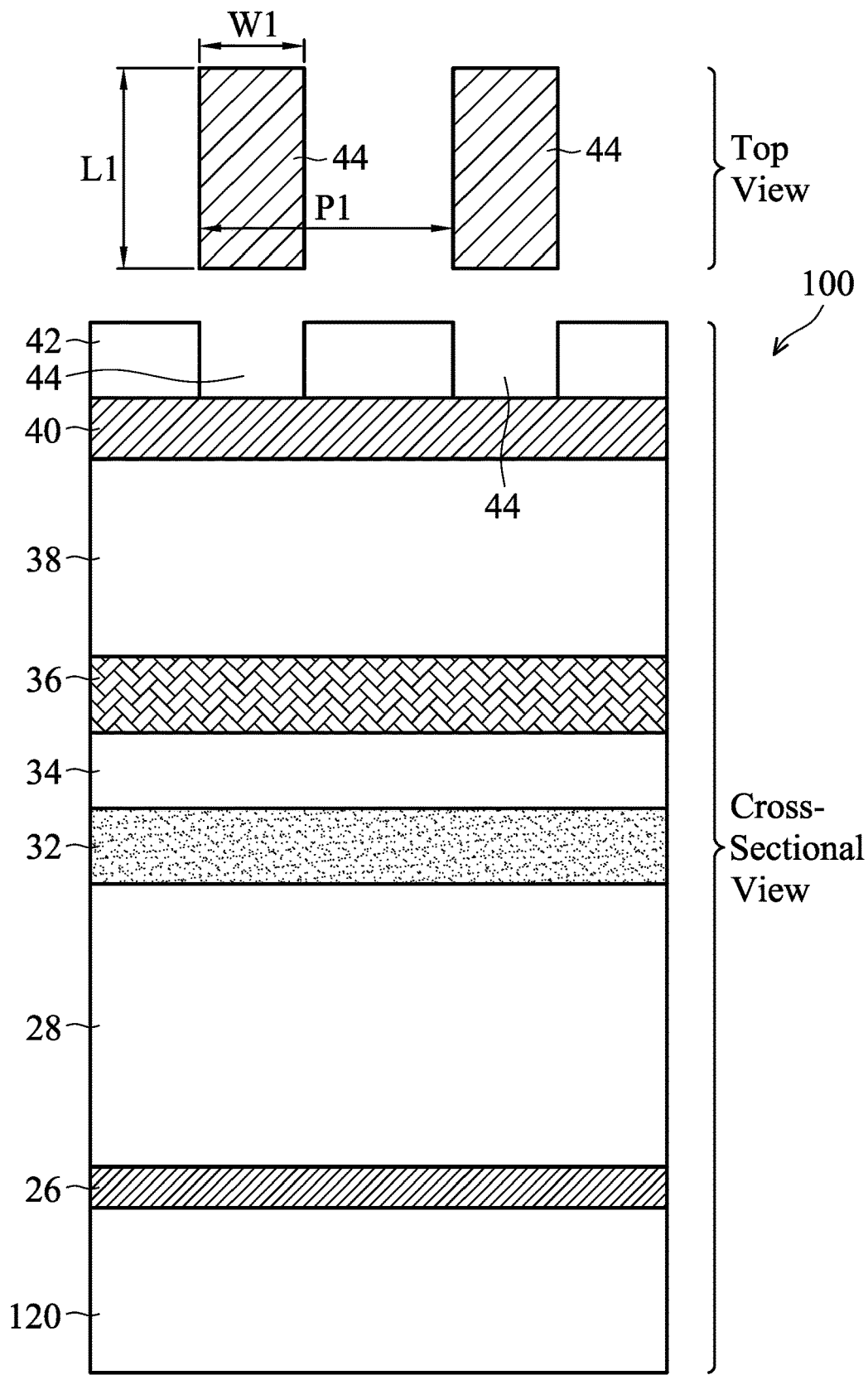
FIGS. 1A, 1B, and 2 to 27 illustrate top and cross-sectional views of various intermediate stages of fabrication of a semiconductor structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A, 1B, and 2 through 27 illustrate top views and cross-sectional views of intermediate stages in the formation of features in a target layer (e.g. an underlying mandrel layer) in accordance with some exemplary embodiments. Some of figures include a top view and a cross-sectional view of wafer 100 in the same figure, wherein the edges of the illustrated features in the top view may be substantially aligned to the edges of the illustrated features in the respective cross-sectional view.

FIG. 1A illustrates wafer 100 in an intermediate stage of patterning a semiconductor device, in accordance with an embodiment. FIG. 1A illustrates top and cross-sectional views of the semiconductor device at an intermediate stage of processing. Wafer 100 includes a substrate 120. Substrate 120 may include, for example, bulk silicon, doped or undoped, or an active layer of a semiconductor-on-insulator (SOI) substrate. Generally, an SOI substrate includes a layer of a semiconductor material, such as silicon, formed on an insulator layer. The insulator layer may be, for example, a buried oxide (BOX) layer or a silicon oxide layer. The insulator layer is provided on a substrate, such as silicon or glass substrate. Alternatively, the substrate 120 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Figure 1B:
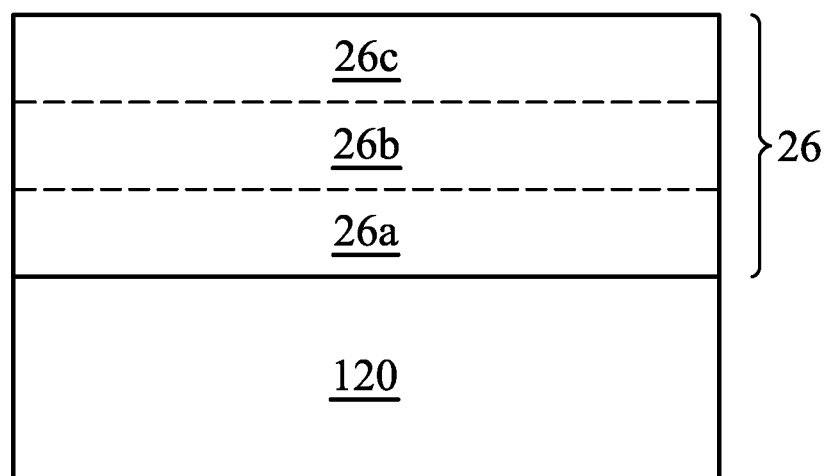

As shown in FIG. 1A, the wafer includes an etch stop layer 26 formed over the substrate 120. The etch stop layer 26 may include a plurality of layers. The etch stop layer 26 may act as a mask (e.g. a tri-layer mask) for a subsequent etching that transfers a pattern of a target layer 28 overlying the etch stop layer 26 to the substrate 120. Referring to FIG. 1B, the etch stop layer 26 may include a first pad layer 26a, which may be a thin film formed of an oxide (e.g. silicon oxide). Accordingly, first pad layer 26a may be referred to as a pad oxide layer. In accordance with some embodiments of the present disclosure, pad oxide layer 26a is formed in a thermal oxidation process, wherein a top surface layer of the substrate 120 is oxidized. Pad oxide layer 26a may have a thickness between about 10 Å and about 50 Å (e.g. about 25 Å).

Pad oxide layer 26a may act as an adhesion layer between the substrate 120 and a second pad layer 26b, which may be formed of a nitride (e.g. silicon nitride), for example, using Low-Pressure Chemical Vapor Deposition (LPCVD). Accordingly, second pad layer 26b may be referred to as a pad nitride layer. In accordance with other embodiments of the present disclosure, pad nitride layer 26b is formed by thermal nitridation of silicon, Plasma Enhanced Chemical Vapor Deposition (PECVD), or plasma anodic nitridation. Pad nitride layer 26b may have a thickness between about 200 Å and about 300 Å (e.g. about 260 Å). In accordance with some embodiments of the present disclosure, the etch stop layer 26 may include an oxide layer 26c formed over the pad nitride layer 26b. In accordance with some embodiments, the oxide layer 26c may include silicon oxide and may be formed using, for example, PECVD or Chemical Vapor Deposition (CVD). The oxide layer 26c may have a thickness between about 400 Å and about 800 Å (e.g. about 600 Å). Target layer 28 is further formed over etch stop layer 26. In some embodiments, target layer 28 is a layer that is to be etched in subsequent steps, in which a plurality of patterns is to be formed therein in accordance with embodiments of the present disclosure. In some embodiments, the target layer 28 may include amorphous silicon, amorphous carbon, $AlO_xN_y$, another material that has a high etching selectivity with the underlying etch stop layer 26, the like, or a combination thereof, and may be formed using CVD, Atomic Layer Deposition (ALD), the like, or a combination thereof. The target layer 28 may be referred to, in some embodiments, as a first mandrel layer or an underlying mandrel layer.

As seen in FIG. 1A, a first mask layer 32 may overlie the target layer 28, and a second mask layer 34 may overlie the first mask layer 32. In some embodiments, the first mask layer 32 may be a first hard mask layer and the second mask layer 34 may be a second hard mask layer. The first mask layer 32 may include silicon nitride, titanium nitride, titanium oxide, the like, or a combination thereof, and may be formed using CVD, PVD, ALD, the like, or a combination thereof. In some embodiments, the first mask layer 32 may have a thickness between about 100 Å and about 500 Å. The second mask layer 34 may include tetraethyl orthosilicate (TEOS), carbon-doped silicon oxide (SiCOH), $SiO_xC_y$, the like, or a combination thereof, and may be formed using spin-on coating, CVD, ALD, the like, or a combination thereof. In some embodiments, the second mask layer 34 may have a thickness between about 100 Å and about 500 Å. In some embodiments, materials for the first mask layer 32 and the second mask layer 34 are chosen such that the first mask layer 32 and the second mask layer 34 have desired etch rates for subsequent patterning processes. As described below in greater detail, the second mask layer 34 is patterned by transferring multiple patterns to the second mask layer 34. The multiple patterns in the second mask layer 34 are subsequently transferred to the first mask layer 32, and the patterns of the first mask layer 32 are subsequently transferred to the target layer 28.

Second mandrel layer 36 is formed over second mask layer 34. In some embodiments, second mandrel layer 36 (which may be referred to as an overlying mandrel layer) may include amorphous silicon, amorphous carbon, $AlO_xN_y$, another material that has a high etching selectivity with the underlying second mask layer 34, the like, or a combination thereof, and may be formed using CVD, ALD, the like, or a combination thereof.

Over second mandrel layer 36 is disposed a first tri-layer mask including under layer (sometimes referred to as a bottom layer) 38, middle layer 40 over under layer 38, and upper layer 42 over middle layer 40. Under layer 38 may include an organic material, such as a spin-on carbon (SOC) material, or the like, and may be formed using spin-on coating, CVD, ALD, or the like. In some embodiment, a thickness of the under layer 38 may be between about 500 Å and about 2000 Å. Middle layer 40 may include an inorganic material, which may be a nitride (such as SiN, TiN, TaN, or the like), an oxynitride (such as SiON), an oxide (such as silicon oxide), or the like, and may be formed using CVD, ALD, or the like. In some embodiments, a thickness of the middle layer 40 may be between about 100 Å and about 400 Å. Upper layer 42 may include an organic material, such as a photoresist material, and may be formed using a spin-on coating, or the like. In some embodiment, a thickness of upper layer 42 may be between about 500 Å and about 1500 Å. In some embodiments, middle layer 40 has a higher etch rate than upper layer 42, and upper layer 42 is used as an etch mask for patterning of middle layer 40. Under layer 38 has a higher etch rate than middle layer 40, and middle layer 40 is used as an etch mask for patterning of under layer 38.

After the application of upper layer 42, upper layer 42 is patterned to form openings 44 therein. Upper layer 42 is patterned using suitable photolithography techniques. In some embodiments where upper layer 42 includes a photoresist material, the photoresist material is irradiated (exposed) and developed to remove portions of the photoresist material. In some embodiments, each of the openings 44 has a width $W_1$ between about 30 nm and about 50 nm, and a length $L_1$ between about 60 nm and about 6000 nm. As shown in the top view (also in FIG. 1A) of wafer 100, openings 44 may have strip shapes. In some embodiments, pitch P1 of openings 44 is about three times width W1 of openings 44. Throughout the description, the patterns of openings 44 are also referred to as line-Al patterns.

Figure 2:
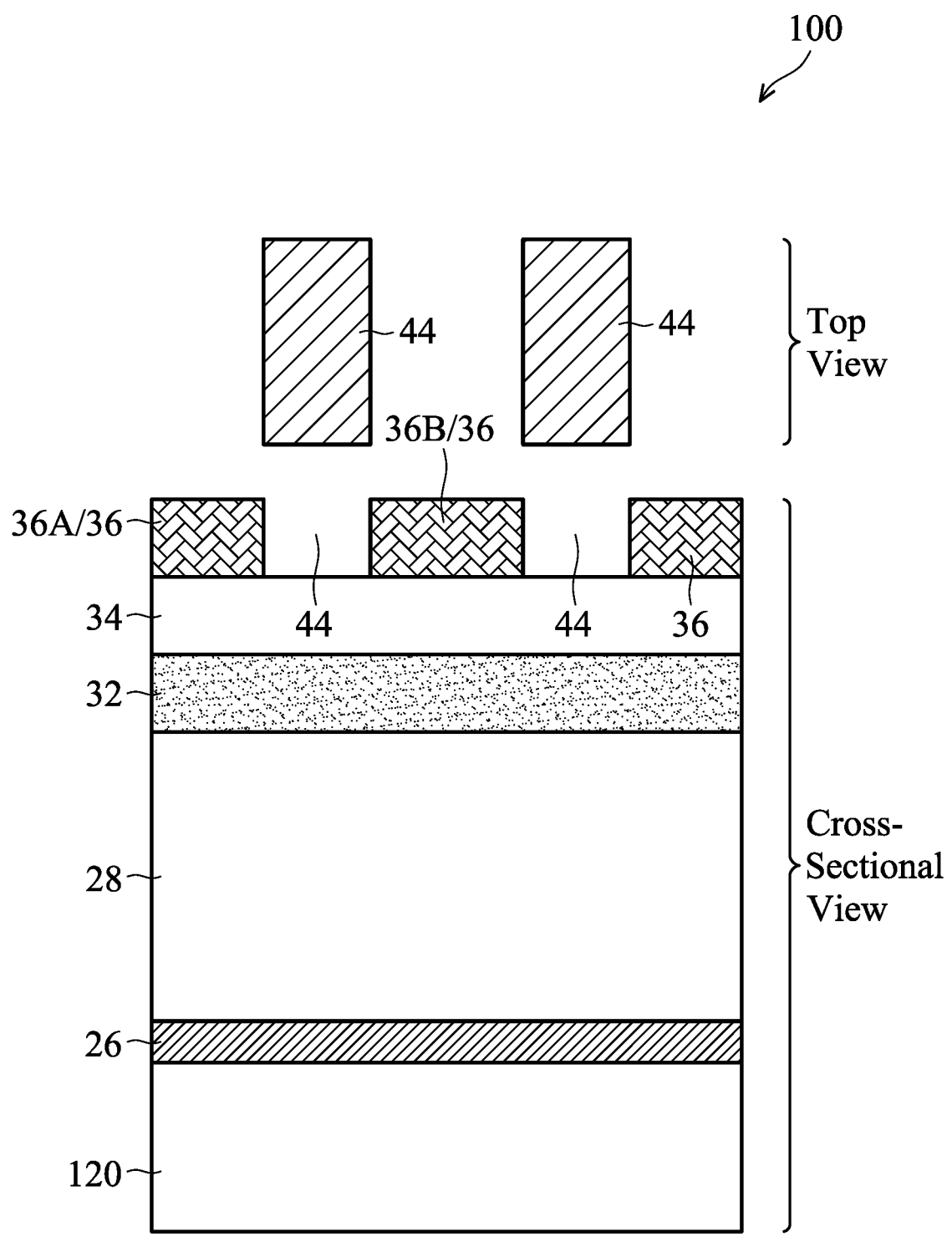

A first etching process is subsequently performed to transfer the pattern in upper layer 42 to second mandrel layer 36, resulting in the structure shown in FIG. 2. During the etching step, upper layer 42, middle layer 40, and under layer 38 may be consumed. If any residue of upper layer 42, middle layer 40, and under layer 38 is left after the patterning, the residue is also removed. The etching is anisotropic, so that openings 44 in second mandrel layer 36 have the same sizes as their respective openings 44 in upper layer 42 (FIG. 1A). The one or more etching processes may include isotropic wet etching processes, anisotropic dry etching processes, or combinations thereof. The remaining portions of second mandrel layer 36 in FIG. 2 are referred to as intermediate mandrels, which include intermediate mandrels 36A and 36B.

Figure 3:
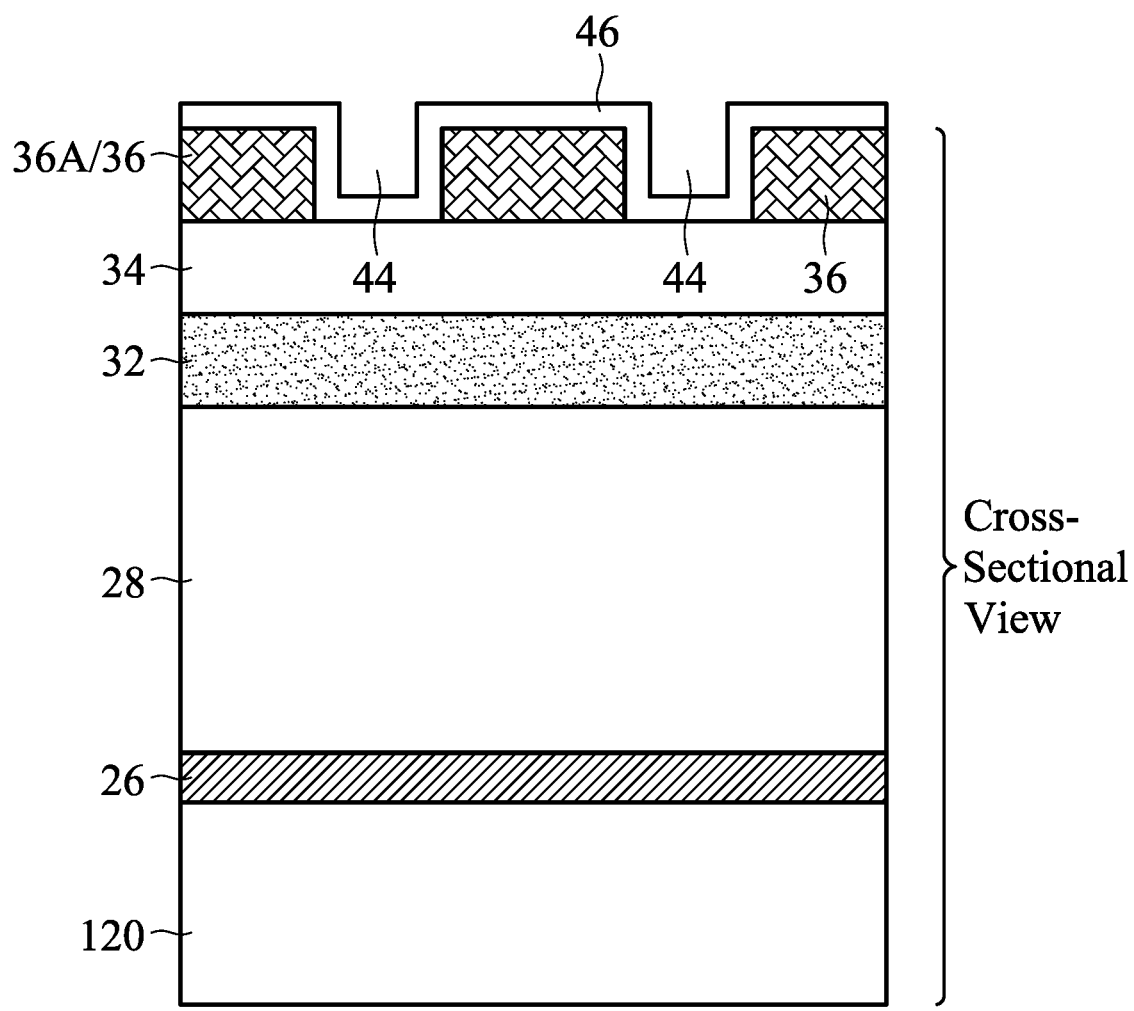

Referring to FIG. 3, first spacer layer 46 is conformally formed (e.g. by ALD) over intermediate mandrels 36A and 36B and in openings 44. Accordingly, a width and a length of openings 44 are reduced by about two times a thickness $T_1$ of first spacer layer 46. First spacer layer 46 may include an oxide (such a silicon oxide, aluminum oxide, titanium oxide, or the like), a nitride (such as SiN, titanium nitride, or the like), an oxynitride (such as SiON, or the like), an oxycarbide (such as SiOC, or the like), a carbonitride (such as SiCN, or the like), the like, or a combination thereof, and may be formed using, CVD, PECVD, ALD, the like, or a combination thereof. In some embodiments, the thickness $T_1$ of first spacer layer 46 may be between about 100 Å and about 200 Å.

Figure 4:
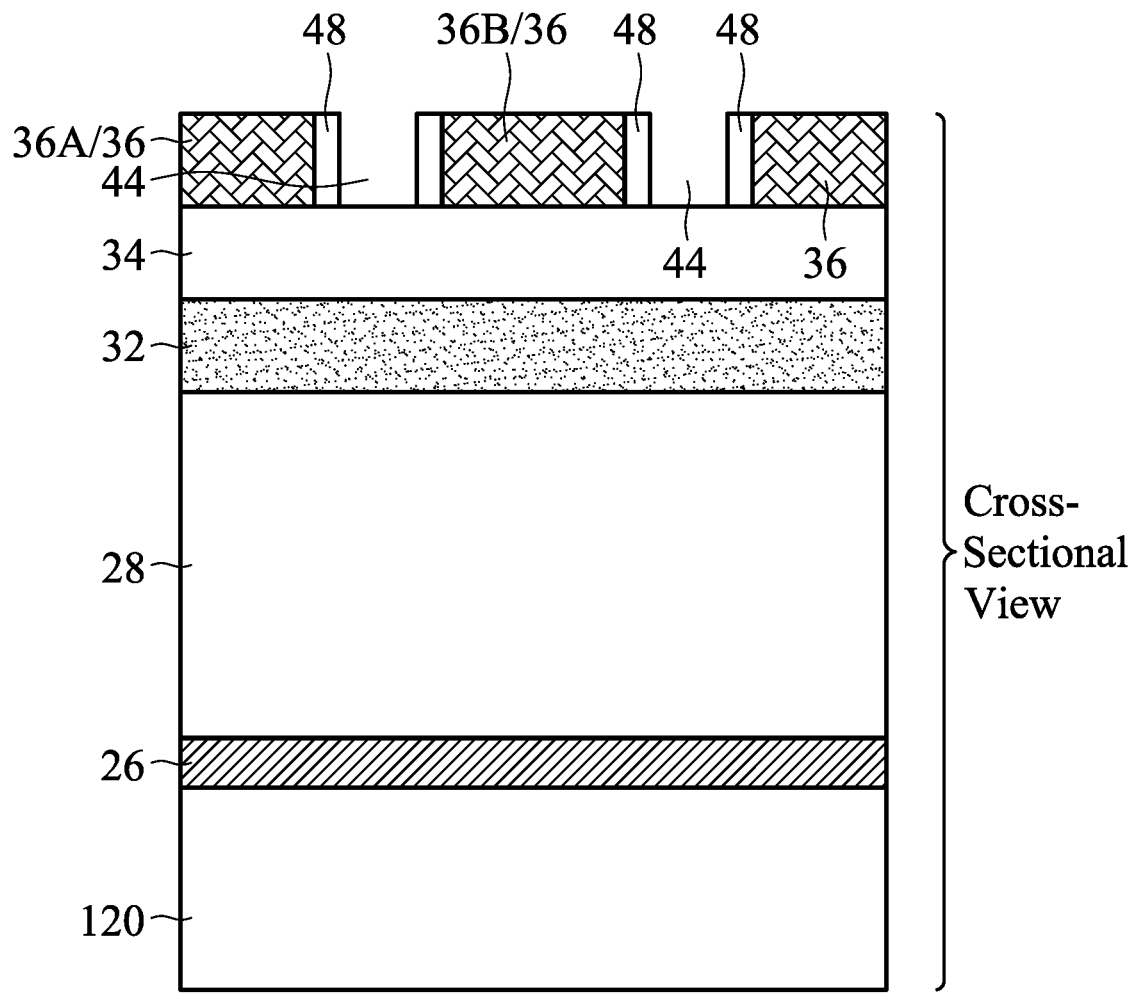

Referring to FIG. 4, first spacer layer 46 is patterned to form first spacers 48 on sidewalls of openings 44. In some embodiments, first spacer layer 46 is patterned using an anisotropic dry etch process to remove horizontal portions of first spacer layer 46 from an upper surface of intermediate mandrels 36A and 36B and bottoms of openings 44. Portions of first spacer layer 46 remaining on the sidewalls of openings 44 form first spacers 48. In some embodiments, first spacer layer 46 is patterned by a dry etch process with etch process gases including $Cl_2$, $O_2$, $C_xH_yF_z$, $N_2$, $H_2$, HBr, $Cl_2$, He, the like, or a combination thereof. Following this, intermediate mandrels 36A and 36B may be removed. This process of removing intermediate mandrels 36A and 36B is shown in FIGS. 5 and 6.

Figure 5:
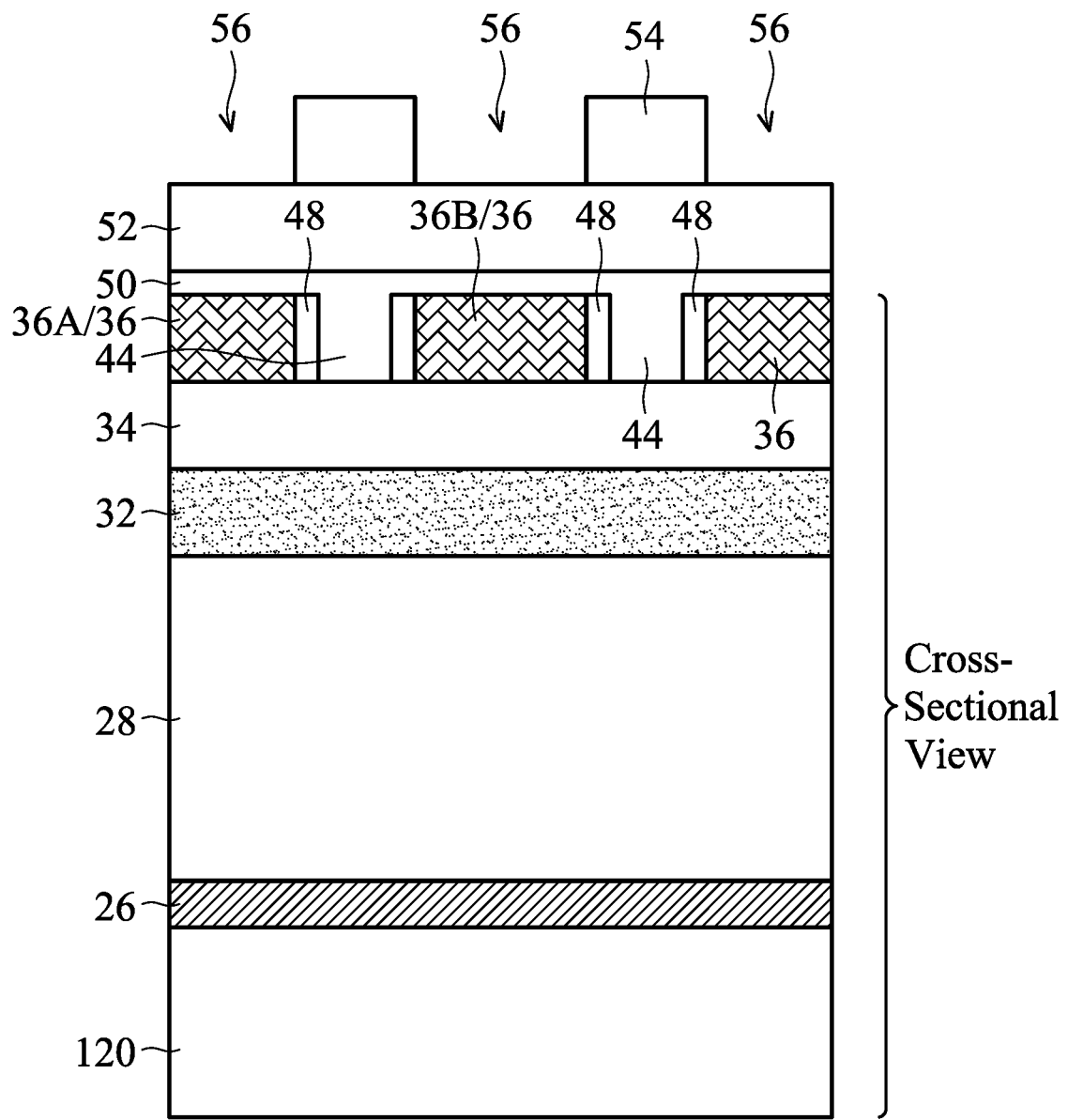

Referring to FIG. 5, a second tri-layer mask is formed over intermediate mandrels 36A and 36B and the first spacers 48. The second tri-layer mask includes under layer 50, a middle layer 52 over under layer 50, and upper layer 54 over the middle layer 52. In some embodiments, under layer 50, middle layer 52, and upper layer 54 may be formed using similar materials and methods as under layer 38, middle layer 40, and upper layer 42 of the first tri-layer mask, respectively, described above with reference to FIG. 1A, and the description is not repeated herein for the sake of brevity. In some embodiments, a thickness of the under layer 50 may be between about 500 Å and about 2000 Å, a thickness of the middle layer 52 may be between about 100 Å and about 400 Å, and a thickness of the upper layer 54 may be between about 500 Å and about 1500 Å. Upper layer 54 is patterned to form openings 56 such that openings 44 in intermediate mandrels 36A and 36B are protected by upper layer 54. In some embodiments, the upper layer 54 may be patterned using similar methods as upper layer 42 of the first tri-layer mask described above with reference to FIG. 1A, and the description is not repeated herein for the sake of brevity. In the illustrated embodiment, three openings 56 are formed in upper layer 54. In other embodiments, less than or more than three openings 56 may be formed in upper layer 54.

Figure 6:
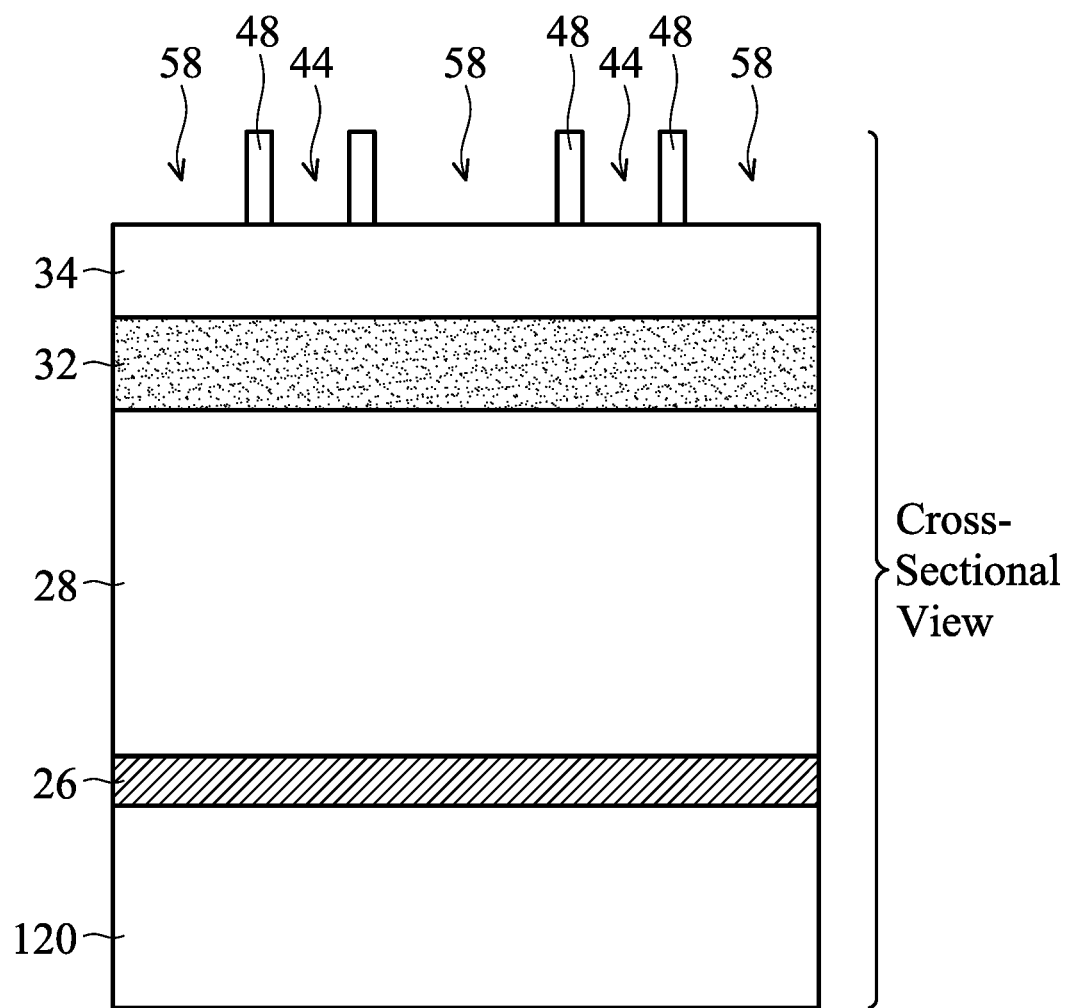

Referring to FIG. 6, a patterning process is performed to remove intermediate mandrels 36A and 36B. In some embodiments, the patterning process includes one or more etching processes, where the second tri-layer mask and the first spacers 48 are used as a combined etch mask to form openings 58 in locations previously occupied by intermediate mandrels 36A and 36B. The one or more etching processes may include isotropic wet etching processes, anisotropic dry etching processes, or combinations thereof. During the patterning process used to remove intermediate mandrels 36A and 36B, upper layer 54, middle layer 52, and under layer 50 may be consumed. A pattern of the openings 58 may also be referred to as a line-B (LB) pattern. Accordingly, the photolithography process described with reference to FIG. 5 may also be referred to as LB photolithography, and the etch processes described with reference to FIG. 6 may also be referred to as LB etch.

Figure 7:
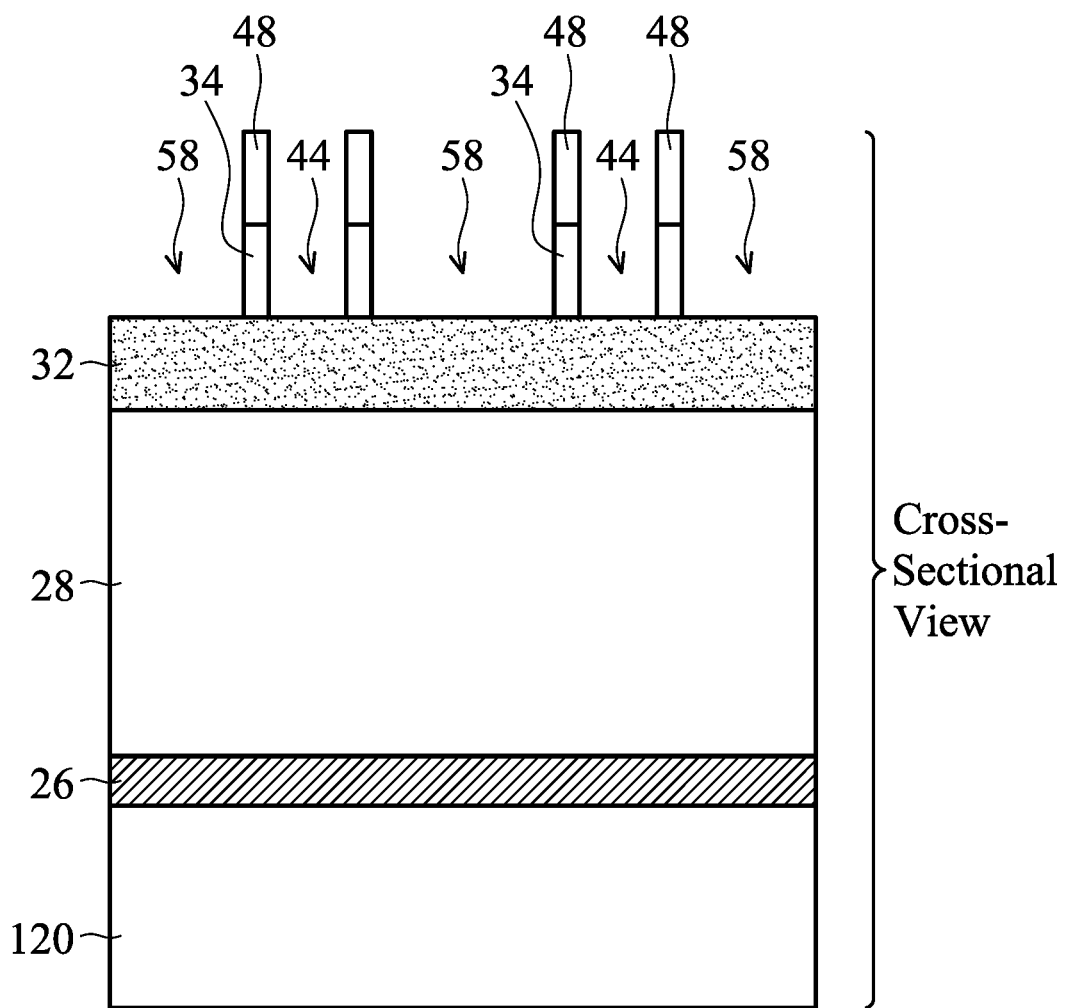

Referring to FIG. 7, first spacers 48 are used, in conjunction with a patterning process, as an etching mask to etch the underlying second mask layer 34, so that openings 58 and 44 extend into second mask layer 34. The patterning process may include one or more etching processes, where first mask layer 32 is used as an etch stop layer. In some embodiments, the patterning process may include a dry etch processes with etch process gases including $O_2$, $CO_2$, $C_xH_yF_z$, Ar, $N_2$, $H_2$, HBr, $Cl_2$, He, the like, or a combination thereof, or any other suitable etchant that can remove the exposed portions of second mask layer 34 without damaging first mask layer 32.

Figure 8:
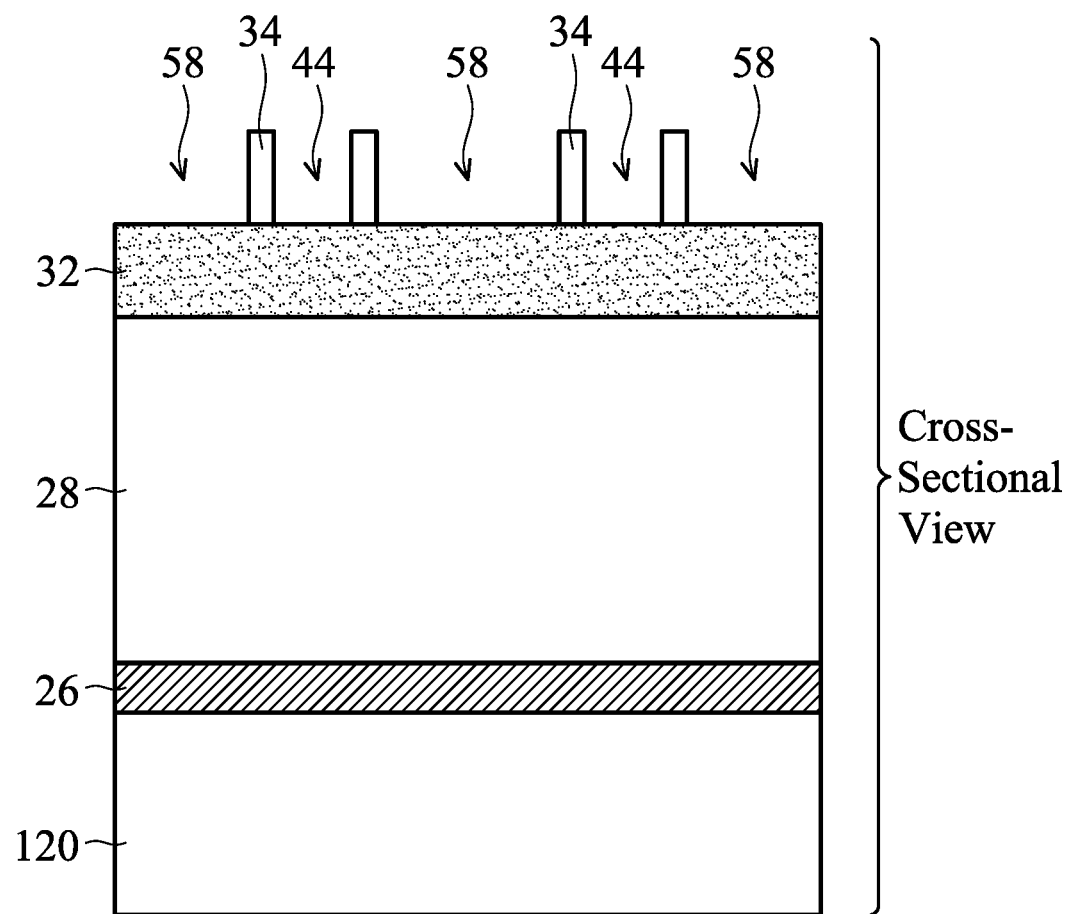

Referring to FIG. 8, first spacers 48 may be selectively removed using, for example, one or more suitable etch processes. In some embodiments, first spacers 48 may be removed using, for example, a dry etch processes with etch process gases including $O_2$, $Cl_2$, $CO_2$, $C_xH_yF_z$, Ar, $N_2$, $H_2$, the like, or a combination thereof.

Figure 9:
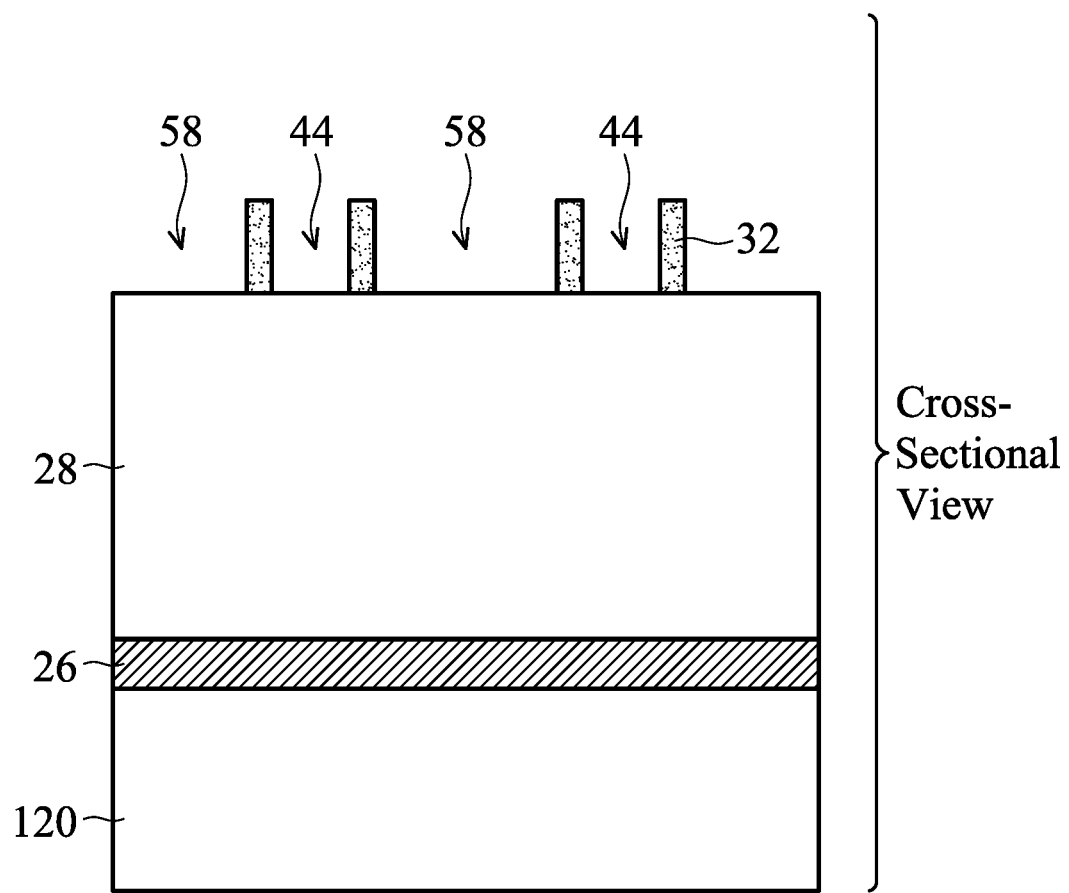

Referring to FIG. 9, a patterning process is performed on the first mask layer 32 to transfer the openings 58 and 44 to the first mask layer 32. The patterning process forms openings in the first mask layer 32 that correspond to respective openings 58 and 44. The openings in the first mask layer 32 expose portions of the target layer 28 (e.g. including amorphous silicon). In some embodiments, the patterning process includes a suitable etch process, where the second mask layer 34 is used as an etch mask. A suitable etch processes may include an isotropic wet etching process, an anisotropic dry etching process, or combinations thereof. In some embodiment, the first mask layer 32 is patterned using, for example, a dry etch processes with etch process gases including $Cl_2$, $O_2$, $C_xH_yF_z$, $N_2$, $H_2$, the like, or a combination thereof. Subsequently, the second mask layer 34 is removed using, for example, a suitable etch process. In some embodiments, the second mask layer 34 is removed using, for example, a dry etch processes with etch process gases including $O_2$, $CO_2$, $C_xH_yF_z$, Ar, $N_2$, $H_2$, the like, or a combination thereof.

Figure 10:
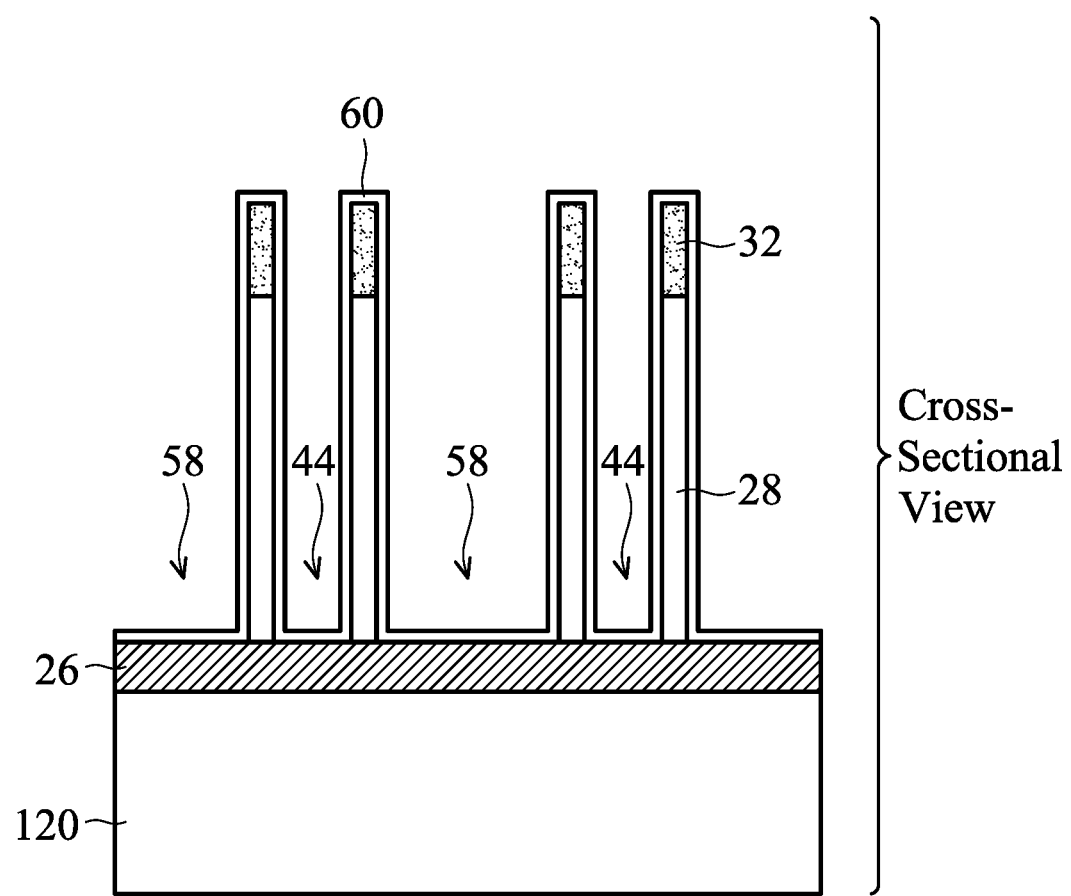

Referring to FIG. 10, a patterning process is performed on the target layer 28 to transfer the pattern of the first mask layer 32 to the target layer 28. The patterning process extends the openings 44 and 58 into the target layer 28 to expose portions of etch stop layer 26. In some embodiments, the patterning process includes one or more suitable etch processes, where the first mask layer 32 (which, as discussed above, may include a nitride, such as silicon nitride) is used as an etch mask. The one or more suitable etch processes may include isotropic wet etching processes, anisotropic dry etching processes, or combinations thereof.

As described above in reference to FIG. 4, first spacers 48 may be etched using, for example, a dry etch processes with etch process gases including $O_2$, $Cl_2$, $CO_2$, $C_xH_yF_z$, Ar, $N_2$, $H_2$, the like, or a combination thereof. Additionally, as described above in reference to FIG. 9, second mask layer 34 may be removed using, for example, another dry etch processes with etch process gases including $O_2$, $CO_2$, $C_xH_yF_z$, Ar, $N_2$, $H_2$, the like, or a combination thereof. Additionally, as described above in reference to FIG. 10, the target layer 28 may be patterned using isotropic wet etching processes, anisotropic dry etching processes, or combinations thereof.

These etch processes of the preceding steps may create a residue layer 60 over at least a portion of exposed portions of etch stop layer 26 (e.g. oxide layer 26c of etch stop layer 26), target layer 28, and first mask layer 32. The residue layer 60 may include carbon, fluorine, or a compound thereof (e.g. a fluorocarbon compound such as $CF_x$). The residue layer 60 is a defect that can induce a pattern fail if it is not removed from wafer 100. Consequently, a cleaning process may be needed to reduce or substantially eliminate the presence of the residue layer 60 from the wafer 100.

Figure 11:
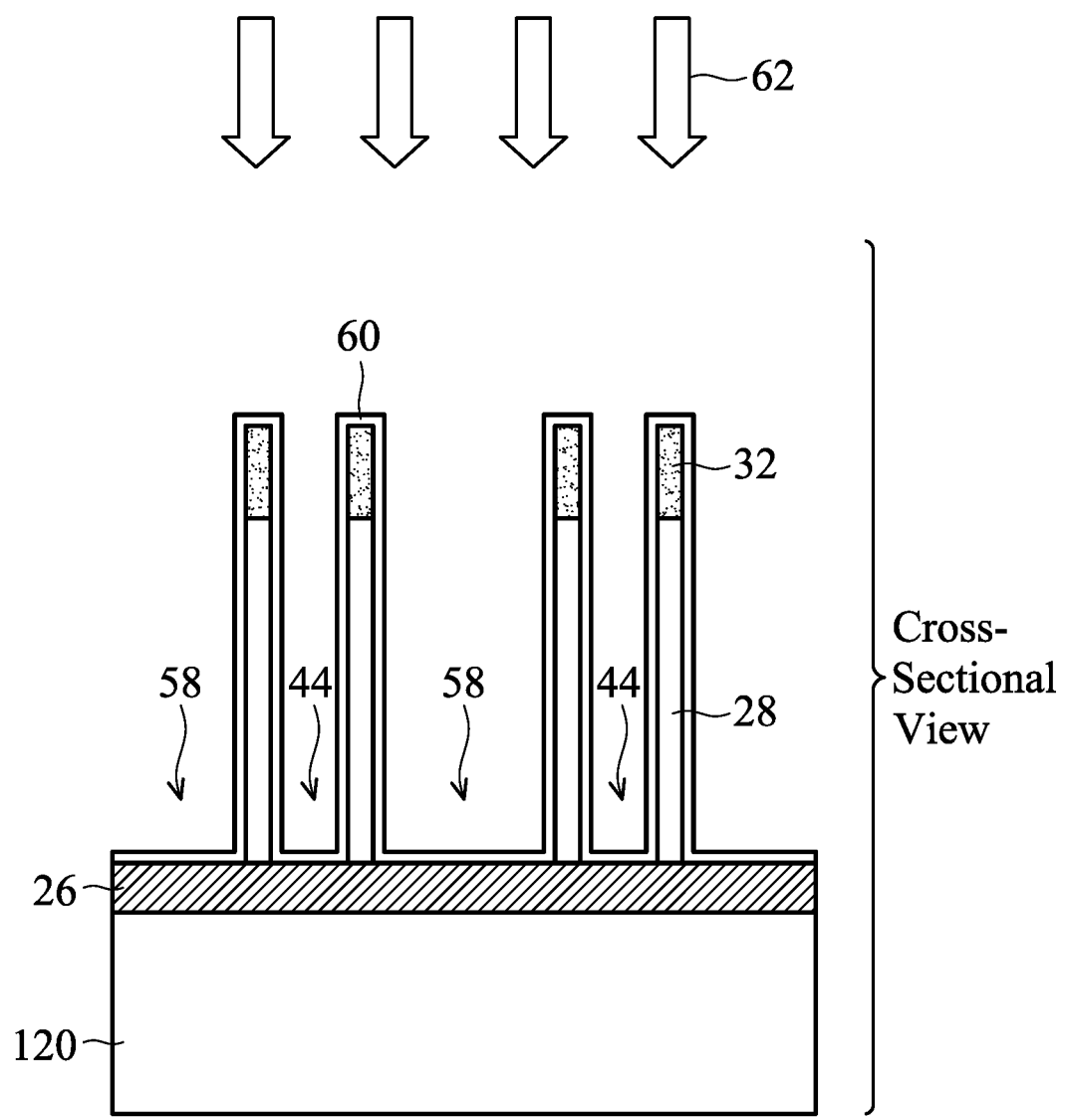
Figure 12:
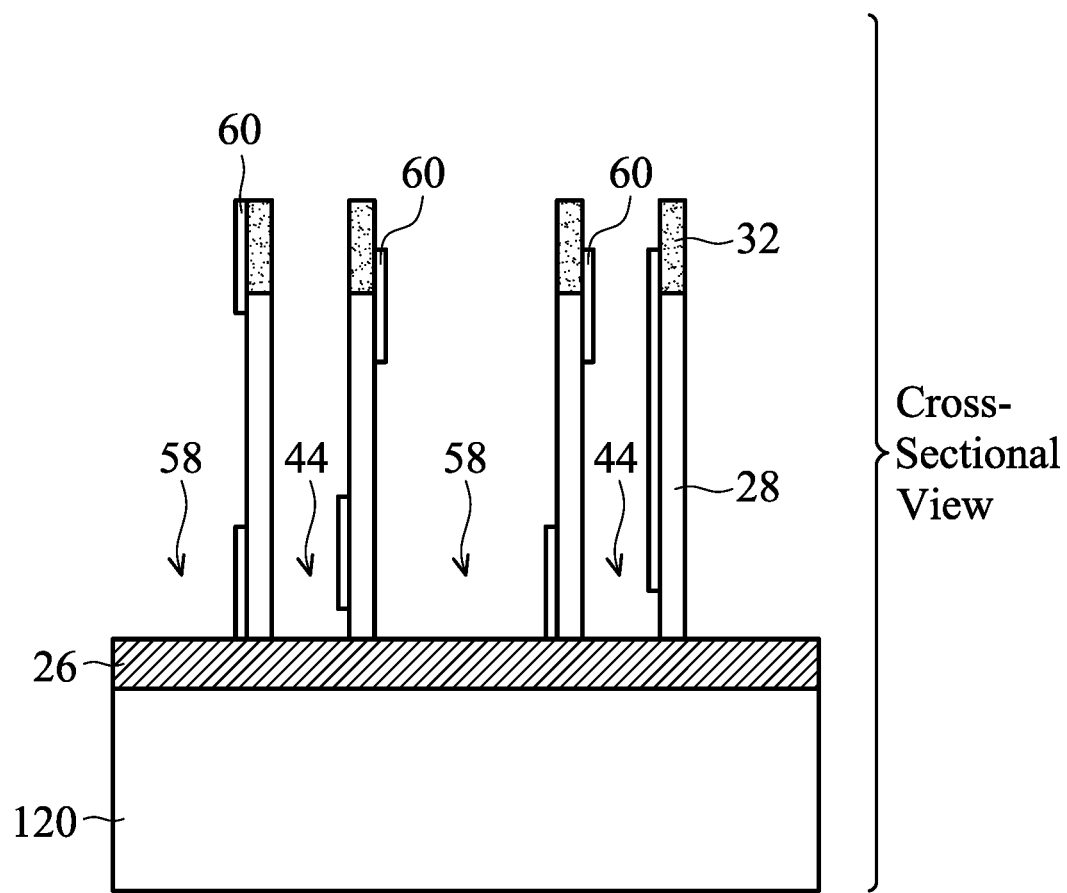

FIG. 11 shows a first cleaning process 62 that may be performed on the structure shown in FIG. 10, in accordance with an embodiment. The first cleaning process 62 may be a wet-clean process that utilizes a first solution. In some embodiments, the first solution may be a mixture including water, hydrogen peroxide, and ammonium hydroxide. In some embodiments, a concentration of the ammonium hydroxide may be between about 10 parts per million and 500 parts per million. As an example, first cleaning process 62 may be a standard cleaning 1 (SC1) process. The first cleaning process 62 may remove a substantial portion of the residue layer 60 to expose at least a portion of first mask layer 32. However, some portions of the residue layer 60 may persist on sidewalls of target layer 28 and first mask layer 32, as shown in FIG. 12. In some examples, the first cleaning process 62 may be performed at room temperature (e.g. about 25 degrees Celsius).

Figure 13:
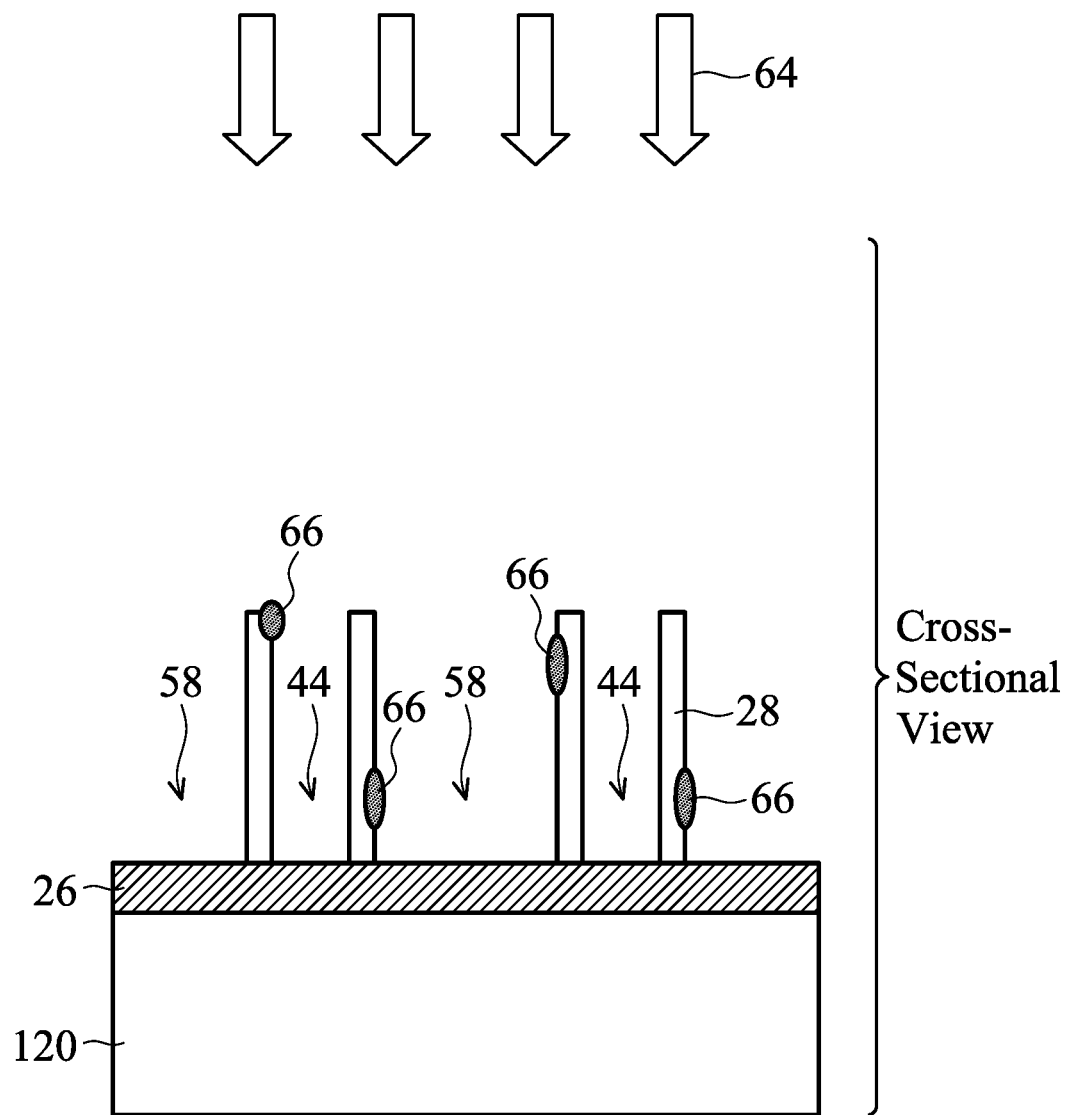

FIG. 13 shows a second cleaning process 64 that may be performed to remove first mask layer 32, in accordance with an embodiment. The second cleaning process 64 may be a wet-clean process that utilizes a second solution. In some embodiments, the second solution may be an acidic solution. As an example, the second solution may be phosphoric acid, which may have a concentration of between about 80%-wt and about 90%-wt. The second cleaning process 64 may be performed at a temperature in a range between about 100 degrees Celsius and about 200 degrees Celsius. An effect of performing the second cleaning process 64 using an acidic solution or at the indicated temperature range may be to cause material of the residue layer 60 to aggregate and form residue condensate 66 remaining on sidewalls of target layer 28. Following this, removal of residue condensate 66 is performed as described below in respect of FIGS. 14-16.

Figure 14:
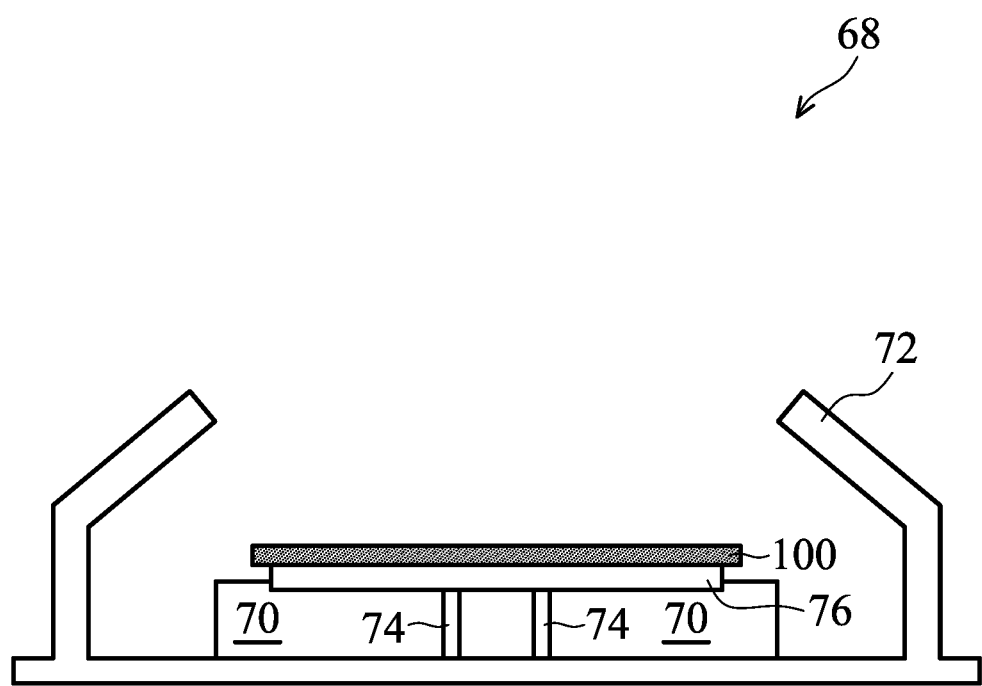

FIG. 14 shows a zoomed-out view of a third cleaning process 68 that is performed on wafer 100, in accordance with an embodiment. As depicted in FIG. 14, wafer 100 may be placed over a support 70 disposed within a chamber 72. In some embodiments, such as in the example shown in FIG. 14, the support 70 may include at least one conduit 74 that may be used to channel deionized water 76 to a back surface of the wafer 100, as shown in FIG. 14. In some embodiments, the back surface of the wafer 100 may be a surface of wafer 100 directed away from substrate 120. In some embodiments deionized water 76 may include carbon dioxide. In such embodiments, the deionized water 76 having carbon dioxide therein may be used to discharge static electricity that may have built up on the wafer 100 as a result of previous processing steps.

Figure 15:
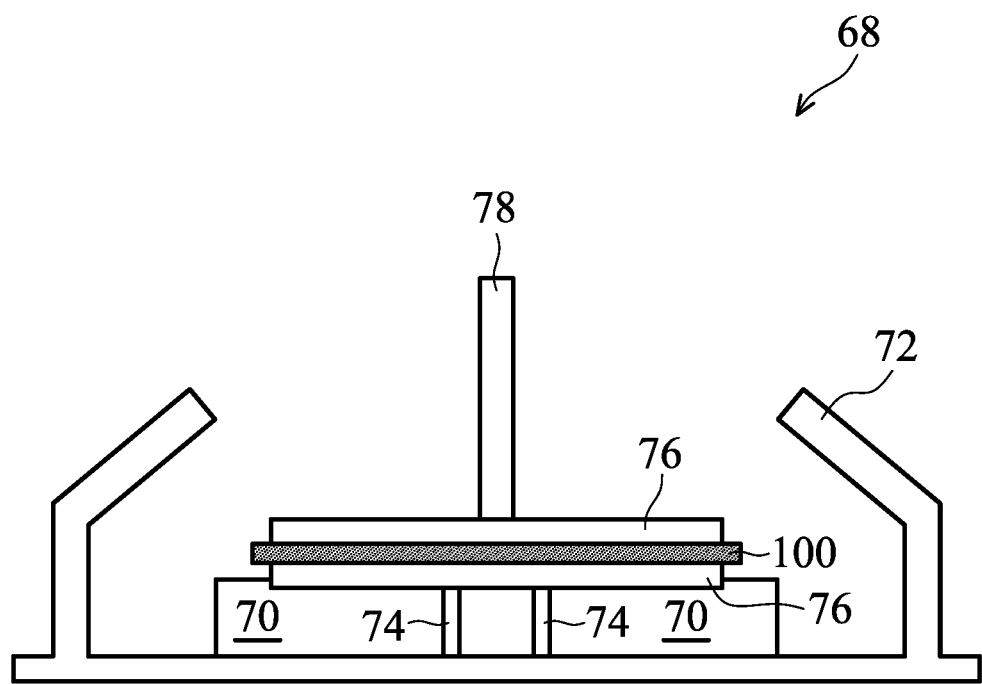

Referring now to FIG. 15, the third cleaning process 68 continues by further applying the deionized water 76 to a front surface of the wafer 100. In some embodiments, the front surface of the wafer 100 may be a surface of wafer 100 over which substrate 120 and subsequent layers are formed. The deionized water 76 may be dispensed over the front surface of the wafer 100 using a nozzle 78 disposed over the wafer 100. The combination of the processes depicted in FIGS. 14 and 15 may have the effect of slowly discharging static electricity that may have built up on the wafer 100 as a result of previous processing steps, so as to prevent or substantially reduce the number of defects formed by the discharge of static electricity from the wafer 100. In some examples, the third cleaning process 68 may be performed at room temperature (e.g. about 25 degrees Celsius).

Figure 16:
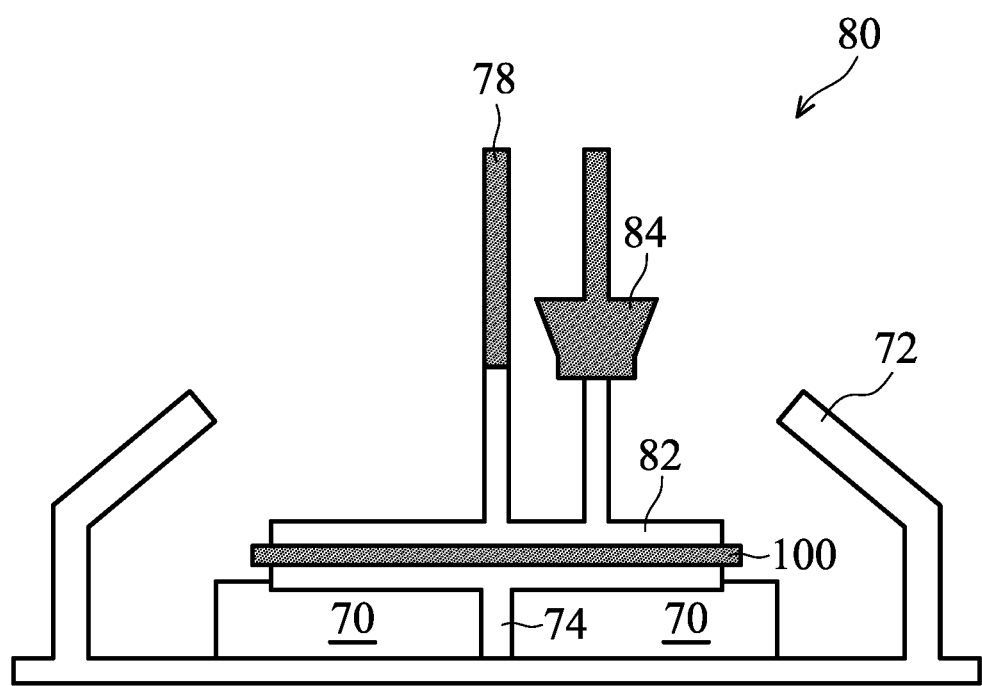

FIG. 16 shows a fourth cleaning process 80 that is performed on wafer 100, in accordance with an embodiment. In the fourth cleaning process 80, the first solution 82, used in the first cleaning process 62, is applied again to wafer 100. In particular, the conduit 74 of support 70 channels the first solution 82 to the back surface of the wafer 100. Additionally, the nozzle 78 dispenses the first solution 82 over the front surface of the wafer 100. In some embodiments, the back surface and the front surface of the wafer 100 are subjected to the first solution 82 simultaneously. In the example shown in FIG. 16, a spray mechanism 84, different from the nozzle 78, may be used in conjunction with the nozzle 78 to dispense the first solution 82. In some embodiments, the first solution 82 may be a mixture including water, hydrogen peroxide, and ammonium hydroxide, where the ammonium hydroxide has a concentration between about 10 parts per million and about 500 parts per million. Additionally or alternatively, the ammonium hydroxide may have a temperature between about 20 degrees Celsius and about 70 degrees Celsius when the fourth cleaning process 80 is performed.

An effect provided by the cleaning processes depicted in FIGS. 14 to 16 is that the residue condensate 66 is substantially removed from sidewalls of the patterned target layer 28 depicted in FIG. 13. As such, the presence of fluorocarbon (e.g. $CF_x$) on the wafer 100 is eliminated or substantially reduced, thereby improving the defect count in wafer 100. Additionally, the cleaning processes depicted in FIGS. 14 to 16 may be used with currently-available wafer cleaning systems, thereby averting the need for retooling or reconfiguration of existing systems.

Figure 17:
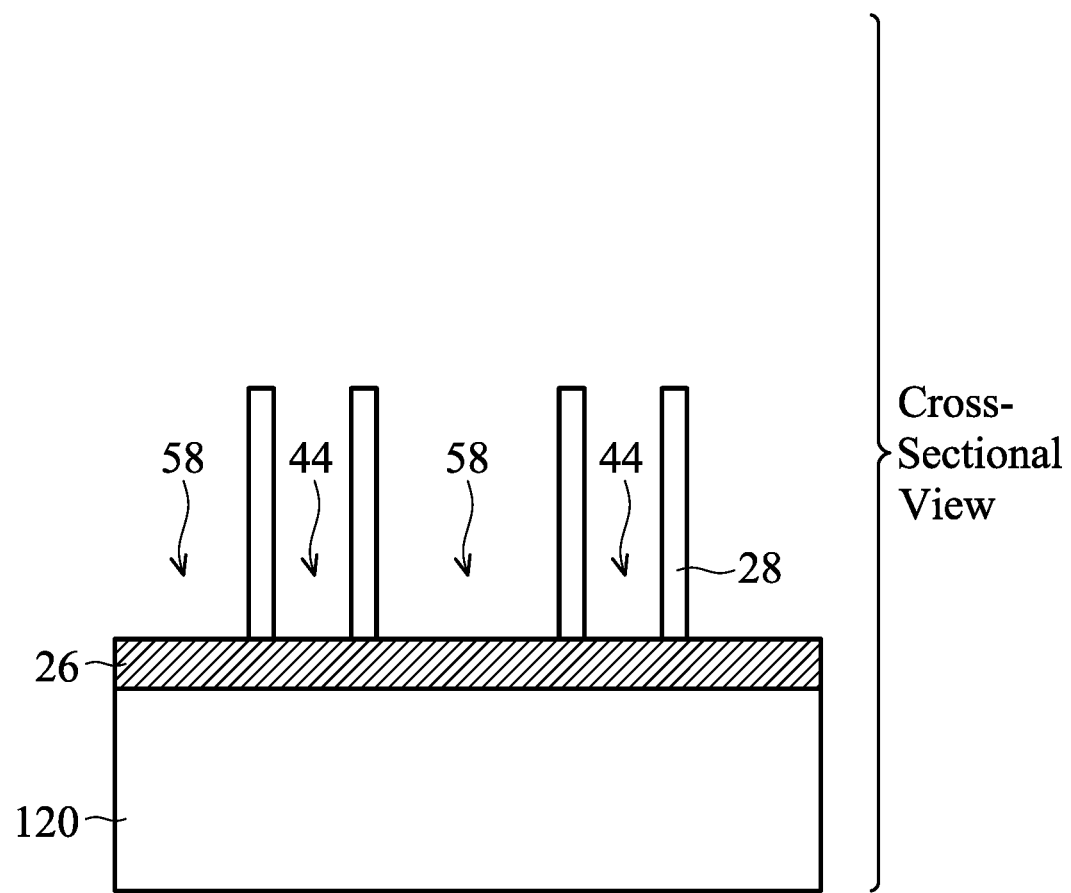
Figure 18:
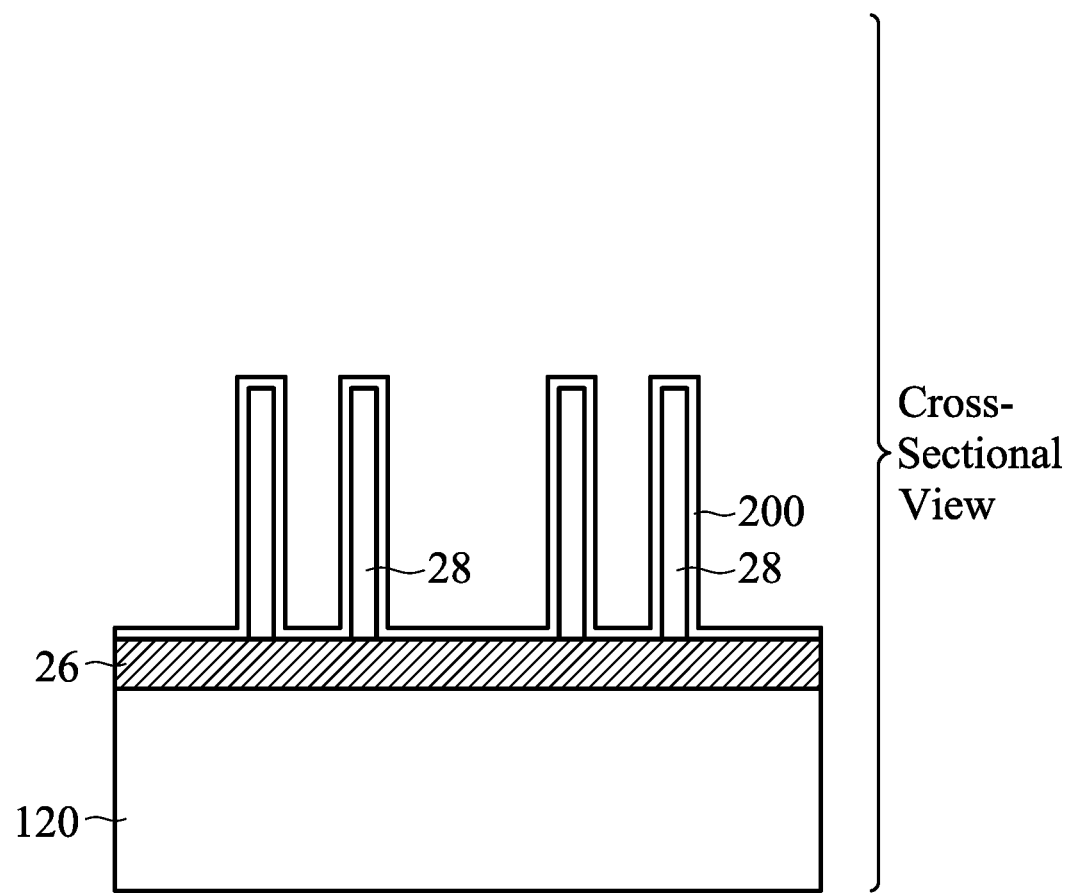

FIG. 17 shows the structure obtained following the cleaning processes depicted in FIGS. 14 to 16. Referring to FIG. 18, second spacer layer 200 is conformally formed over target layer 28 and exposed portions of the etch stop layer 26. The second spacer layer 200 may include similar materials as first spacer layer 46 (e.g. shown in FIG. 3) and may be formed using similar steps as described above in reference to FIG. 3.

Figure 19:
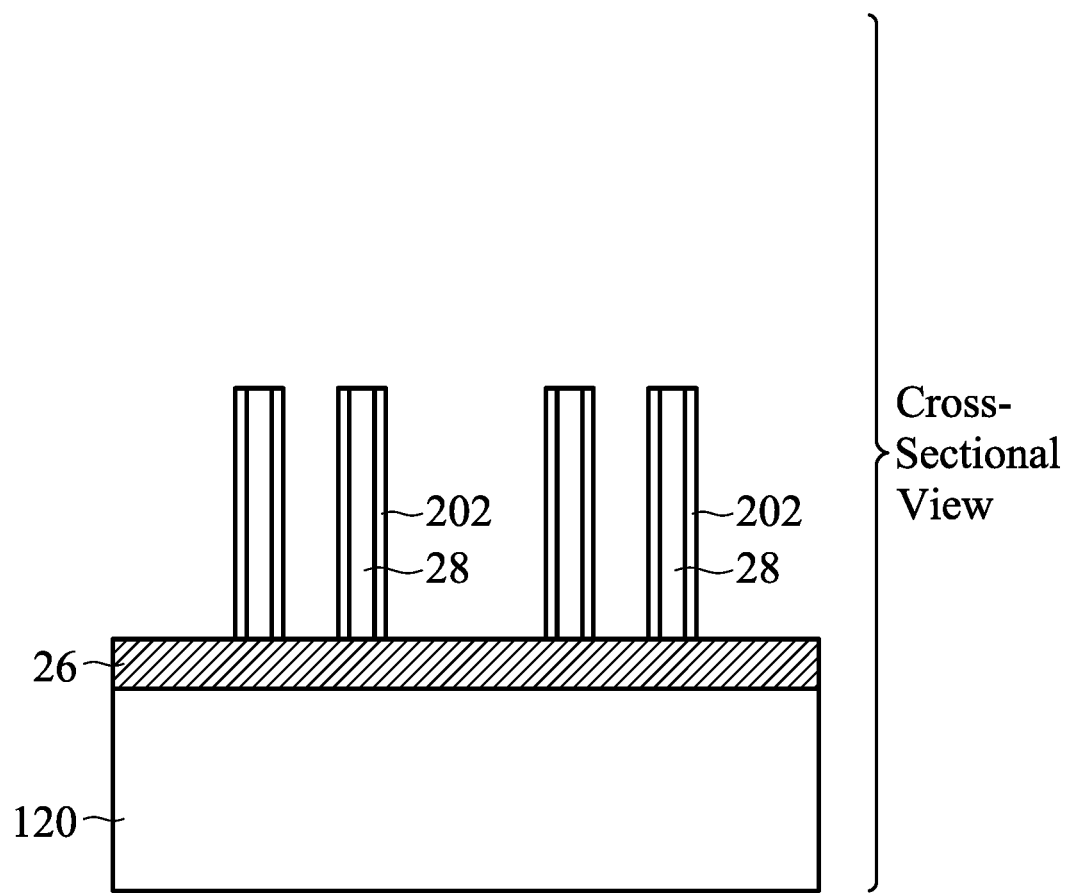

Referring to FIG. 19, second spacer layer 200 is patterned to form second spacers 202 on sidewalls of target layer 28. In some embodiments, second spacer layer 200 is patterned using an anisotropic dry etch process to remove horizontal portions of second spacer layer 200 from an upper surface of the target layer 28 and exposed surfaces of the etch stop layer 26. Portions of second spacer layer 200 remaining on the sidewalls of target layer 28 form second spacers 202. The processes used for patterning the second spacer layer 200 may be similar to processes used for patterning the first spacer layer 46, described above in reference to FIG. 4.

Figure 20:
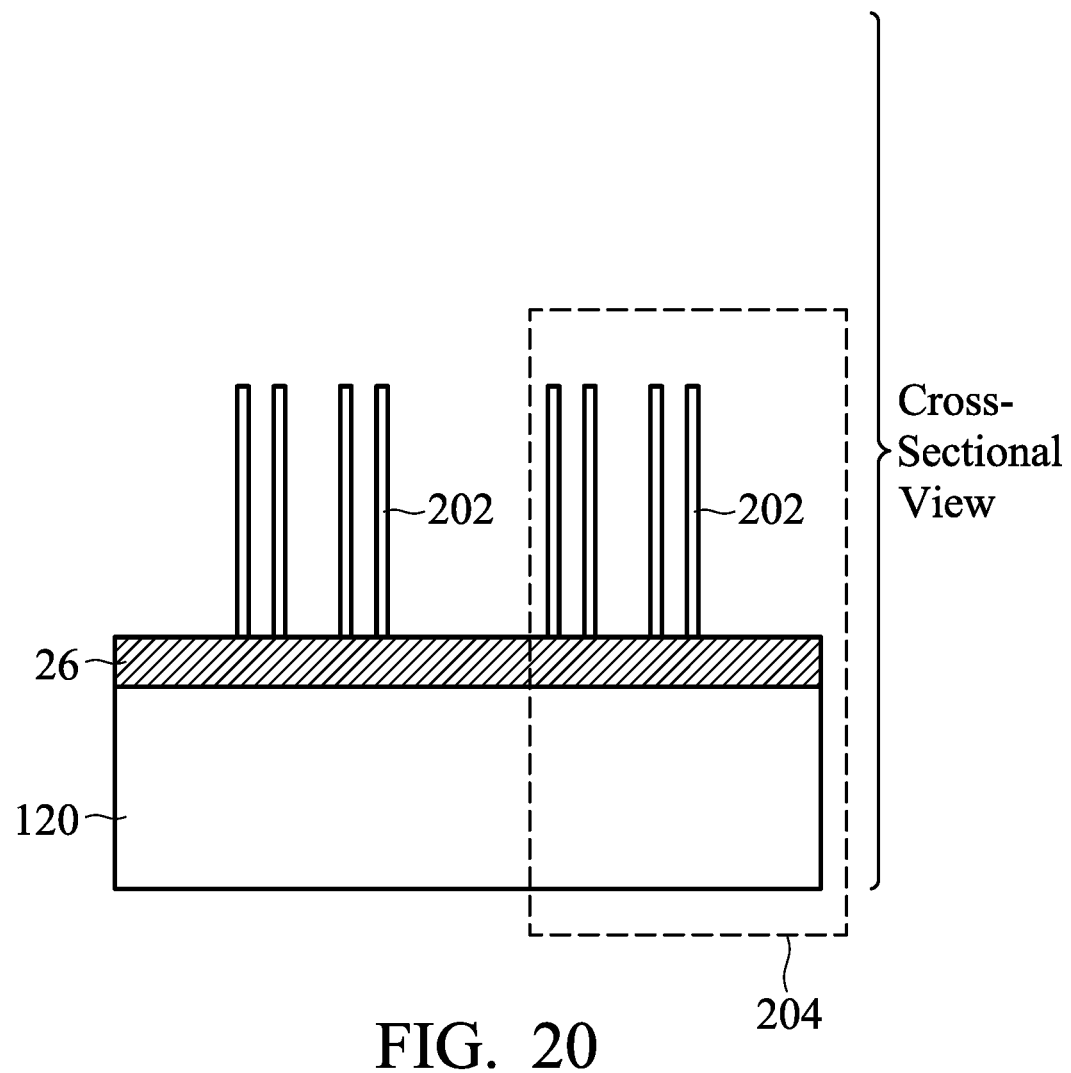

Referring to FIG. 20, the target layer 28 is removed, e.g., using a process described above in FIGS. 5 and 6, which describe the removal of intermediate mandrels 36A and 36B. The process of removing target layer 28 leaves second spacers 202 over the etch stop layer 26, as shown in FIG. 20. From this step, the pattern of the second spacers 202 may be transferred to the substrate 120, via the etch stop layer 26, to form semiconductor strips. FIG. 20 shows a region 204 and FIGS. 21-27 show a magnified view of region 204.

Figure 21:
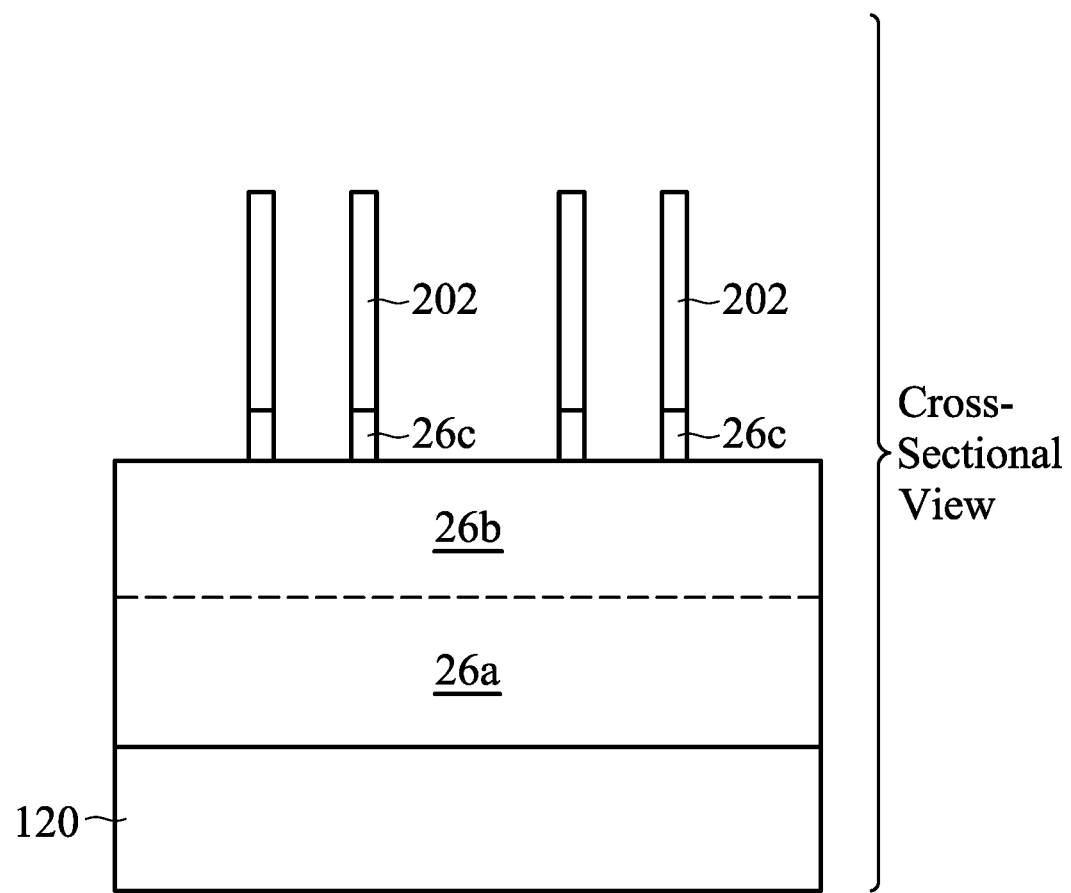
Figure 22:
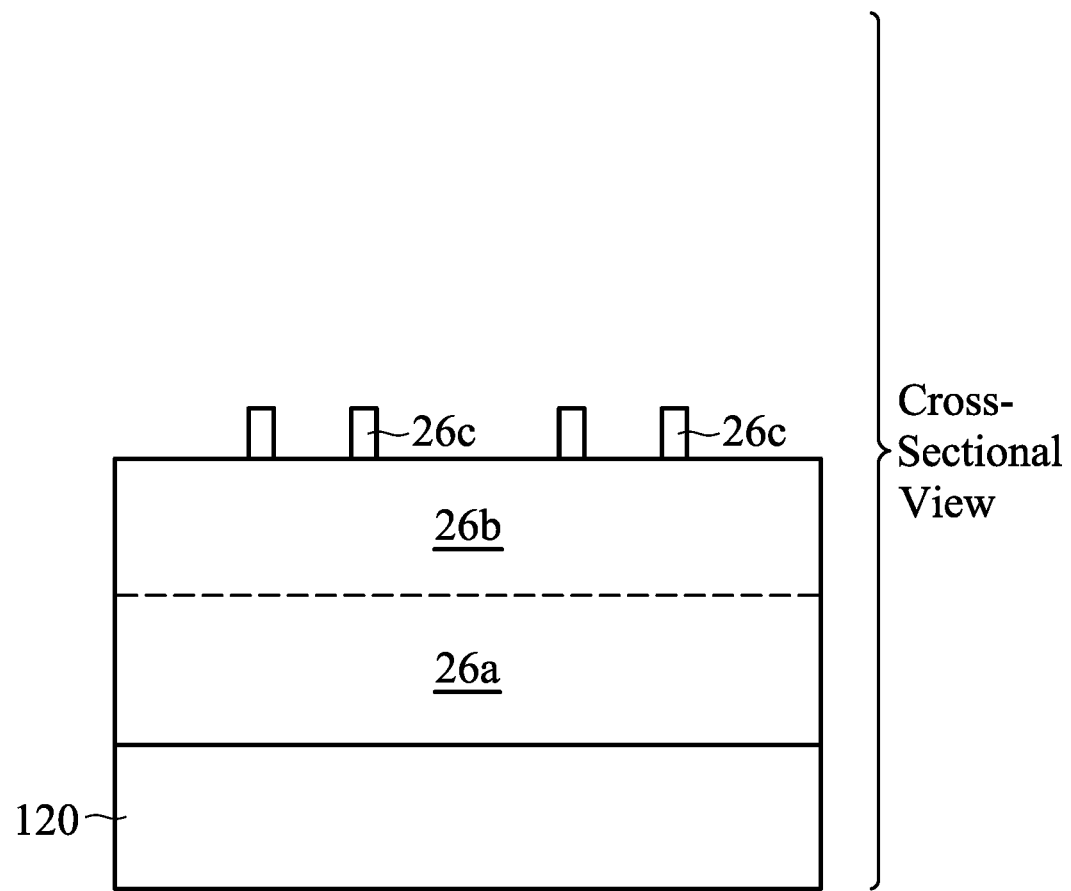

Referring to FIG. 21, oxide layer 26c of the etch stop layer 26 is etched using the second spacers 202 as a mask, e.g. using similar processes as described above in reference to FIG. 7, where second mask layer 34 is patterned. The result of etching the oxide layer 26c is to expose pad nitride layer 26b of the etch stop layer 26, as shown in FIG. 21. Referring to FIG. 22, second spacers 202 may be selectively removed using, for example, one or more suitable etch processes described in reference to FIGS. 7 and 8, where first spacers 48 are selectively removed.

Figure 23:
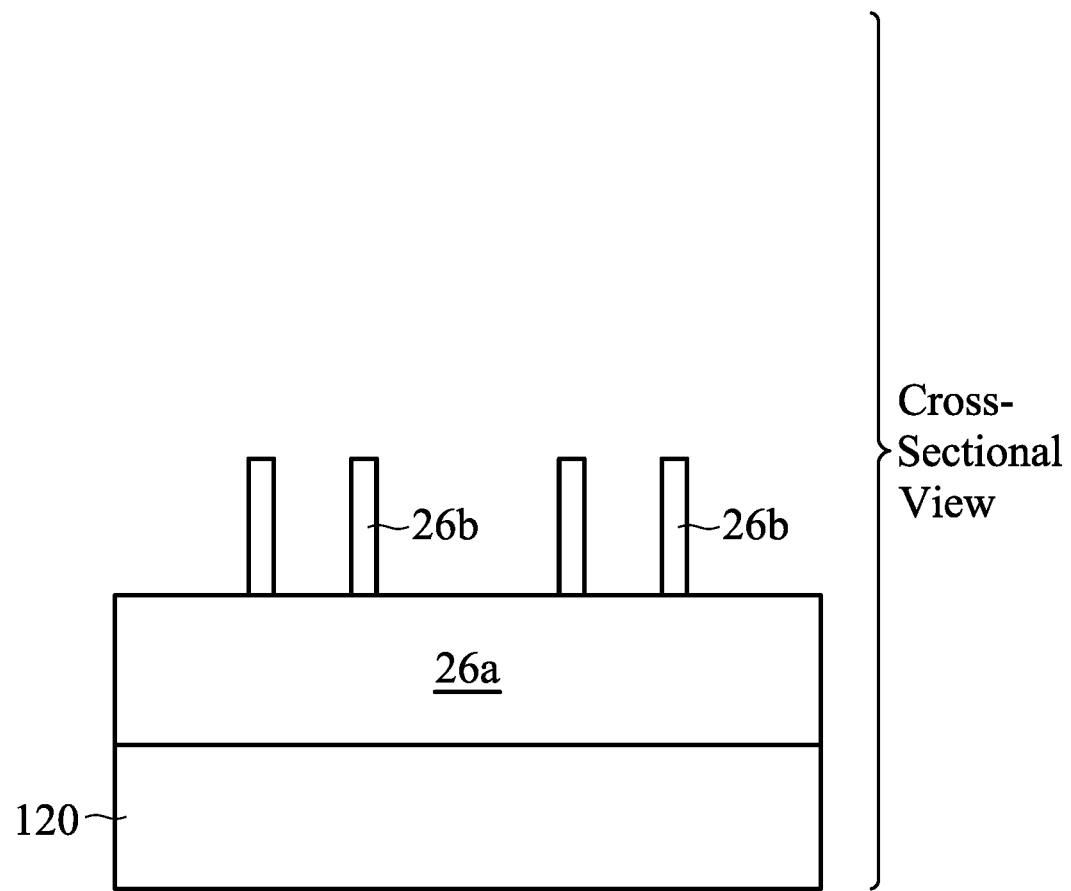

Referring to FIG. 23, the pad nitride layer 26b of the etch stop layer 26 is subsequently etched using the oxide layer 26c as a mask, e.g., using processes described above in reference to FIG. 9 where first mask layer 32 is patterned. In some embodiments, such as in the step depicted in FIG. 23, oxide layer 26c is removed using, for example, a dry etch processes with etch process gases including $O_2$, $CO_2$, $C_xH_yF_z$, Ar, $N_2$, $H_2$, the like, or a combination thereof.

Figure 24:
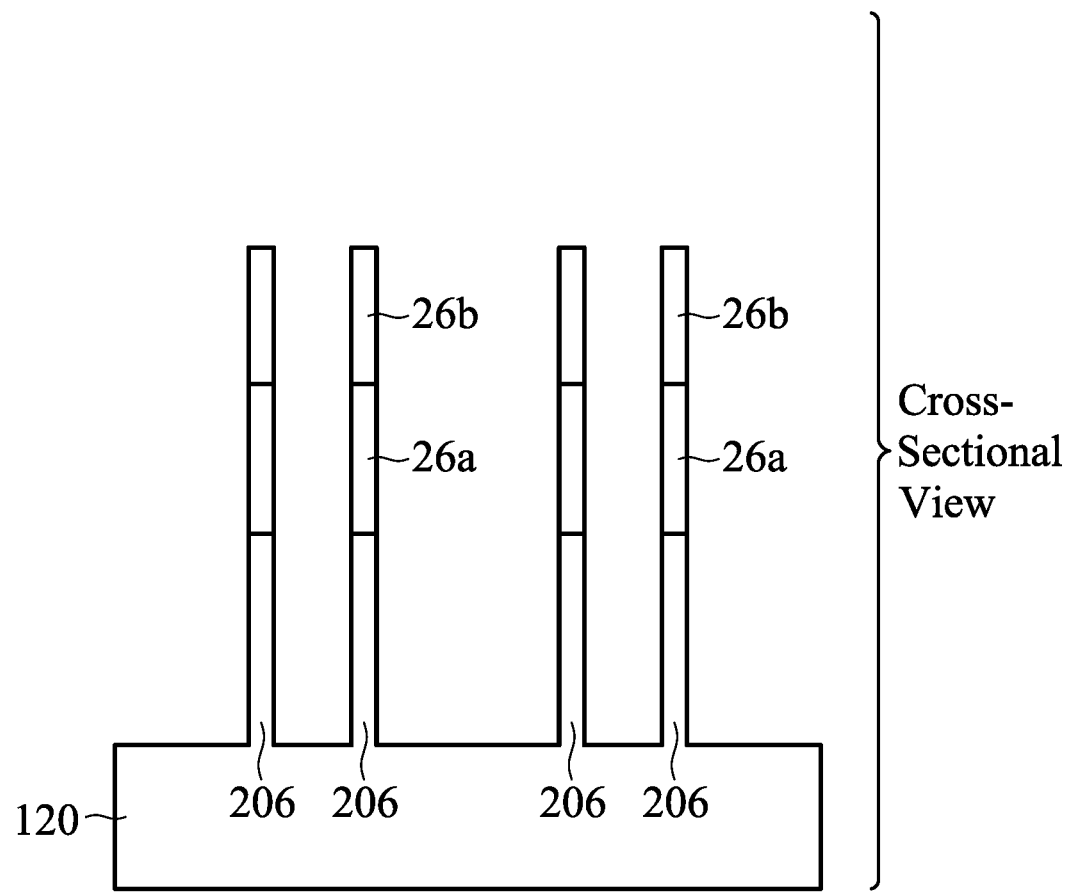

Referring to FIG. 24, the pattern of the pad nitride layer 26b is then transferred to the pad oxide layer 26a and the substrate 120 to form semiconductor strips 206, e.g., using similar processes as described above in reference to FIG. 7, where second mask layer 34 is patterned.

Figure 25:
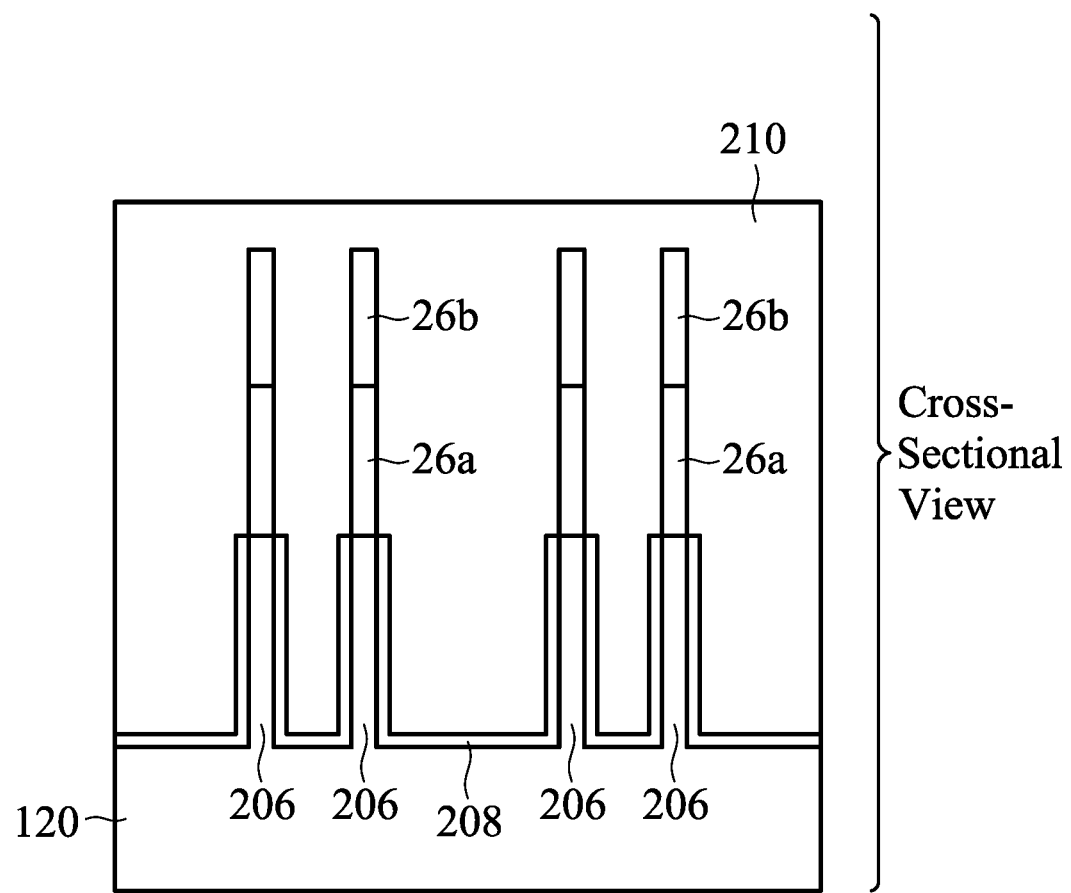

FIG. 25 illustrates the filling of dielectric materials. In accordance with some embodiments, liner oxide 208 is formed on the sidewalls of semiconductor strips 206. Liner oxide 208 may be a conformal layer having horizontal portions and vertical portions having thicknesses close to each other. Liner oxide 208 may be a thermal oxide having a thickness between about 10 Å and about 100 Å in accordance with some exemplary embodiments. In accordance with an embodiment of the present disclosure, liner oxide 208 is formed using In-Situ Steam Generation (ISSG), for example, with water steam or a combined gas of hydrogen ($H_2$) and oxygen ($O_2$) used to oxidize semiconductor strips 206 and substrate 120. In accordance with yet other embodiments, liner oxide 208 is formed using a deposition technique such as Sub Atmospheric Chemical Vapor Deposition (SACVD).

FIG. 25 also illustrates the deposition/formation of dielectric material 210. Dielectric material 210 covers the pad nitride layer 26b, the pad oxide layer 26a, the semiconductor strips 206, and the liner oxide 208. The formation method of dielectric material 210 may be selected from Flowable Chemical Vapor Deposition (FCVD), CVD, ALD, and the like. A treatment may be performed to cure dielectric material 210. The resulting dielectric material 210 may include silicon oxide, for example.

Figure 26:
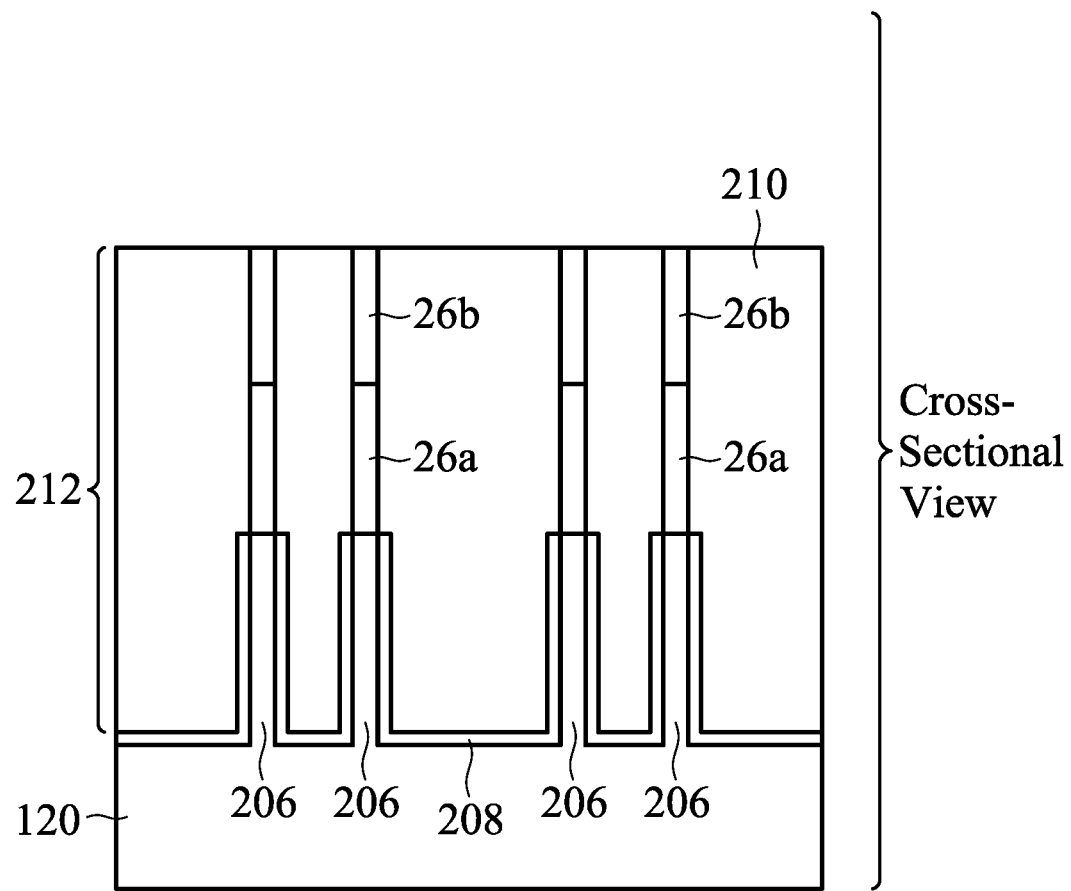

A planarization such as a Chemical Mechanical Polish (CMP) is then performed, as shown in FIG. 26. STI regions 212 are thus formed, which include the liner oxide 208 and remaining portions of the dielectric material 210. Pad nitride layer 26b may be used as the CMP stop layer, and hence the top surface of pad nitride layer 26b is substantially level with the top surface of STI regions 212.

Figure 27:
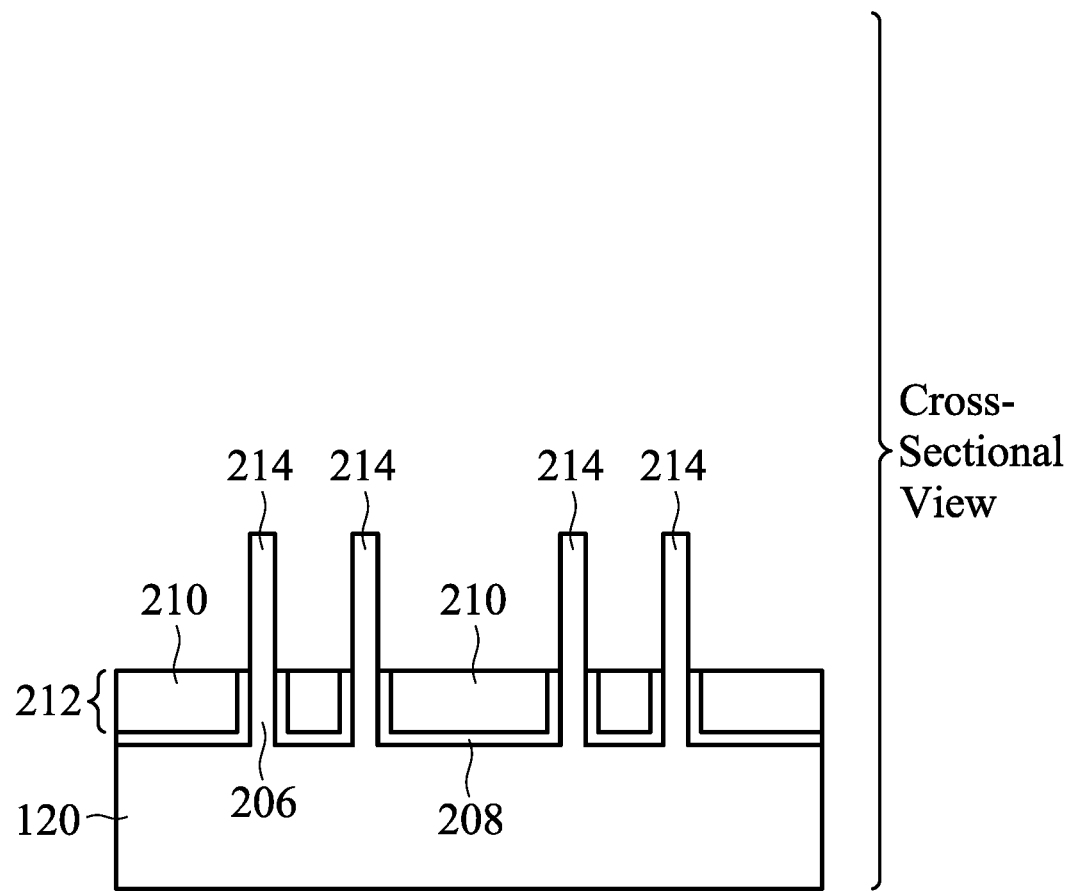

In subsequent process steps, pad nitride layer 26b and pad oxide layer 26a are removed. Next, STI regions 212 are recessed, as depicted in FIG. 27. The top portions of semiconductor strips 206 protrude higher than the top surfaces of remaining STI regions 212 to form protruding semiconductor fins 214. The resulting structure is shown in FIG. 27. In accordance with some embodiments of the present disclosure, the recessing of STI regions 212 is performed using a dry etch method, in which the process gases including $NH_3$ and $HF_3$ are used. In accordance with alternative embodiments of the present disclosure, the recessing of STI regions 212 is performed using a wet etch method, in which the etchant solution is a dilution HF solution. After STI regions 212 are recessed to form semiconductor fins 214, a plurality of process steps is performed on semiconductor fins 214, which process steps may include well implantations, gate stack formation, source/drain formation, and replacement gate formation, thereby forming FinFETs. It is noted that the embodiments described, where FinFETs are formed, are merely exemplary; other embodiments of the present disclosure contemplate the forming of other semiconductor features in the substrate 120.

In an embodiment, a method includes: forming a patterned etch mask over a target layer; patterning the target layer using the patterned etch mask as a mask to form a patterned target layer; performing a first cleaning process on the patterned etch mask and the patterned target layer, the first cleaning process including a first solution; performing a second cleaning process to remove the patterned etch mask and form an exposed patterned target layer, the second cleaning process including a second solution; performing a third cleaning process on the exposed patterned target layer; and performing a fourth cleaning process on the exposed patterned target layer, the fourth cleaning process including the first solution.

In an embodiment, a method includes: forming a mask layer over a first mandrel layer; forming a second mandrel layer over the mask layer; patterning the second mandrel layer to form at least one opening therein; forming first spacers on sidewalls of the at least one opening; patterning the mask layer using the first spacers as a mask to form a patterned mask layer; patterning the first mandrel layer using the patterned mask layer as a mask to form a patterned first mandrel layer; removing the patterned mask layer using a mask removal process, the mask removal process forming a residue on sidewalls of the patterned first mandrel layer; and removing the residue using a residue removal process.

In an embodiment, a method includes: forming a patterned mandrel over a plurality of mask layers, the plurality of mask layers including a first mask layer and a second mask layer overlying the first mask layer; forming spacers on sidewalls of the patterned mandrel; patterning the second mask layer using the spacers as a mask to form a patterned second mask layer; removing the spacers using a dry-etch process; patterning the first mask layer using the patterned second mask layer as a mask to form a patterned first mask layer; removing the patterned second mask layer using the dry-etch process; patterning an underlying mandrel layer using the patterned first mask layer as a mask to form a patterned underlying mandrel layer; removing the patterned first mask layer using a first wet removal process including phosphoric acid, the first wet removal process forming a residue on sidewalls of the patterned underlying mandrel layer; and removing the residue using a second wet removal process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a patterned mandrel on a wafer over a plurality of mask layers, the plurality of mask layers comprising a first mask layer and a second mask layer overlying the first mask layer;
    forming spacers on sidewalls of the patterned mandrel;
    patterning the second mask layer using the spacers as a mask to form a patterned second mask layer;
    removing the spacers using a first dry-etch process;
    patterning the first mask layer using the patterned second mask layer as a mask to form a patterned first mask layer;
    removing the patterned second mask layer using a second dry-etch process;
    patterning an underlying mandrel layer using the patterned first mask layer as a mask to form a patterned underlying mandrel layer;
    removing the patterned first mask layer using a first wet removal process comprising phosphoric acid, the first wet removal process forming a residue on sidewalls of the patterned underlying mandrel layer; and
    removing the residue using a second wet removal process, the second wet removal process being applied to an upper surface of the wafer and a lower surface of the wafer, the lower surface of the wafer being opposite the upper surface of the wafer.

2. The method of claim 1, wherein the second wet removal process comprises a mixture of water, hydrogen peroxide, and ammonium hydroxide.

3. The method of claim 2, wherein, in the second wet removal process, a concentration of ammonium hydroxide is between about 10 parts per million and about 500 parts per million.

4. The method of claim 2, wherein the second wet removal process comprises exposing the patterned underlying mandrel layer to deionized water prior to exposing the patterned underlying mandrel layer to the mixture of water, hydrogen peroxide, and ammonium hydroxide.

5. A method, comprising:

forming a patterned etch mask over a target layer;

patterning the target layer using the patterned etch mask as a mask to form a patterned target layer;

performing a first cleaning process on the patterned etch mask and the patterned target layer, the first cleaning process comprising a first solution;

performing a second cleaning process to remove the patterned etch mask and form an exposed patterned target layer, the second cleaning process comprising a second solution, the second cleaning process forming a residue on sidewalls of the exposed patterned target layer;

performing a third cleaning process on the exposed patterned target layer; and performing a fourth cleaning process on the exposed patterned target layer, the fourth cleaning process comprising the first solution.

6. The method of claim 5, wherein the first solution comprises at least one of water, hydrogen peroxide, and ammonium hydroxide.

7. The method of claim 5, wherein the second solution comprises phosphoric acid.

8. The method of claim 5, wherein patterning the target layer using the patterned etch mask as the mask produces a residue layer on sidewalls of the patterned target layer and the patterned etch mask.

9. The method of claim 8, wherein the residue layer comprises a fluorocarbon compound.

10. The method of claim 5, wherein performing the third cleaning process on the exposed patterned target layer comprises exposing the exposed patterned target layer to deionized water.

11. The method of claim 10, wherein the deionized water comprises carbon dioxide.

12. The method of claim 5, wherein performing the fourth cleaning process on the exposed patterned target layer comprises dispensing the first solution at a temperature between about 20 degrees Celsius and about 70 degrees Celsius.

13. A method, comprising:

forming a patterned etch mask over a target layer;

patterning the target layer using the patterned etch mask as a mask to form a patterned target layer;

performing a first cleaning process on the patterned etch mask and the patterned target layer, the first cleaning process comprising a first solution, the first solution comprises at least one of hydrogen peroxide or ammonium hydroxide;

performing a second cleaning process to remove the patterned etch mask and form an exposed patterned target layer, the second cleaning process comprising a second solution, the second cleaning process forming a residue on sidewalls of the exposed patterned target layer;

performing a third cleaning process on the exposed patterned target layer; and performing a fourth cleaning process on the exposed patterned target layer, the fourth cleaning process comprising the first solution.

14. The method of claim 13, wherein the second solution comprises phosphoric acid.

15. The method of claim 14, wherein patterning the target layer using the patterned etch mask as the mask produces a residue layer on sidewalls of the patterned target layer and the patterned etch mask, wherein the residue layer comprises a fluorocarbon compound.

16. The method of claim 13, wherein patterning the target layer using the patterned etch mask as the mask produces a residue layer on sidewalls of the patterned target layer and the patterned etch mask.

17. The method of claim 16, wherein the residue layer comprises a fluorocarbon compound.

18. The method of claim 13, wherein performing the third cleaning process on the exposed patterned target layer comprises exposing the exposed patterned target layer to deionized water.

19. The method of claim 18, wherein the deionized water comprises carbon dioxide.

20. The method of claim 13, wherein performing the fourth cleaning process on the exposed patterned target layer comprises dispensing the first solution at a temperature between about 20 degrees Celsius and about 70 degrees Celsius.

* * * * *